(12) United States Patent
Lee

(10) Patent No.: US 7,283,392 B2
(45) Date of Patent: Oct. 16, 2007

(54) NAND FLASH MEMORY DEVICE AND METHODS OF ITS FORMATION AND OPERATION

(75) Inventor: Chang-Hyun Lee, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/379,752

(22) Filed: Apr. 21, 2006

(65) Prior Publication Data

US 2006/0239083 A1 Oct. 26, 2006

(30) Foreign Application Priority Data

Apr. 26, 2005 (KR) .................. 10-2005-0034770
May 9, 2005 (KR) .................. 10-2005-0038506

(51) Int. Cl.
*G11C 16/00* (2006.01)
(52) U.S. Cl. ............................. 365/185.17; 365/185.33
(58) Field of Classification Search ............... 257/318, 257/319
See application file for complete search history.

(56) References Cited

U.S. PATENT DOCUMENTS 5,590,072 A * 12/1996 Choi ..................... 365/185.01

6,362,050 B2   3/2002 Kalnitsky et al.
6,867,453 B2 * 3/2005 Shin et al. .................. 257/314

FOREIGN PATENT DOCUMENTS

JP  2003-51557   2/2003
KR  2004-0080019  9/2004

OTHER PUBLICATIONS

English language abstract of Korean Publication No. 2004-0080019.
English language abstract of Japanese Publication No. 2003-51557.

* cited by examiner

*Primary Examiner*—Tan T. Nguyen
(74) *Attorney, Agent, or Firm*—Marger Johnson & McCollom, P.C.

(57) ABSTRACT

A NAND flash memory device, and methods of forming and operating the same are provided. The NAND flash memory device includes first and second selection gate lines sequentially disposed at one side of a plurality of cell gate lines. A first selection transistor including the first selection gate line serves as a buffer for decreasing a highly boosted channel voltage of a non-selected cell to minimize the leakage current of the NAND flash memory device.

17 Claims, 36 Drawing Sheets

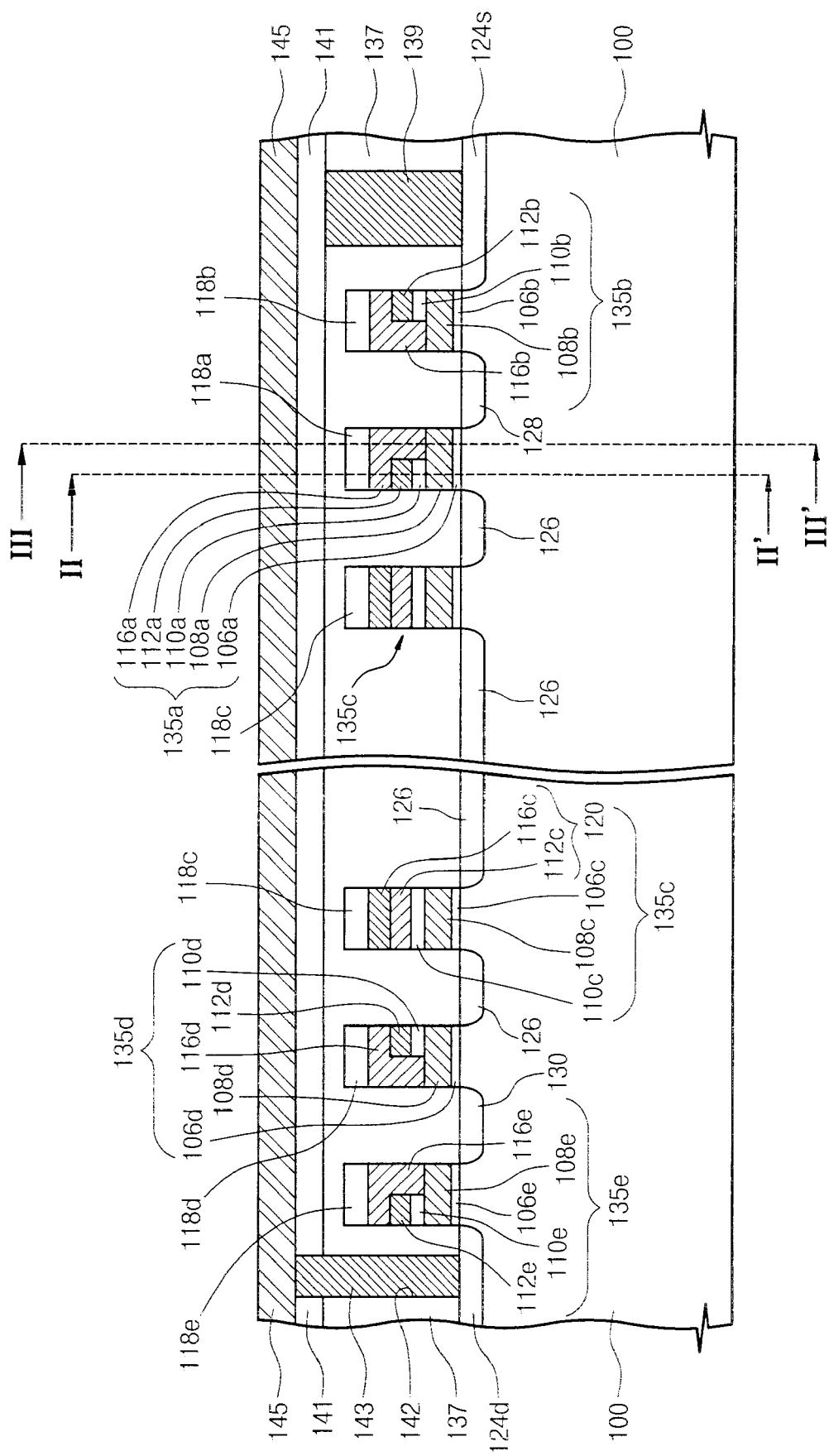

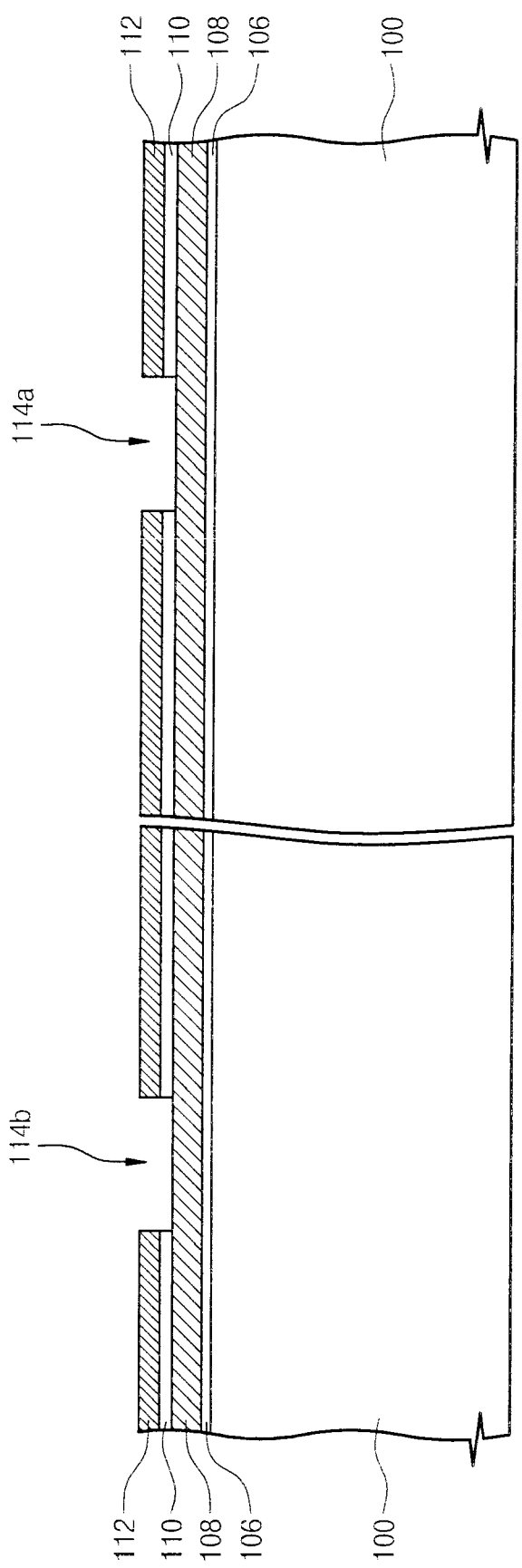

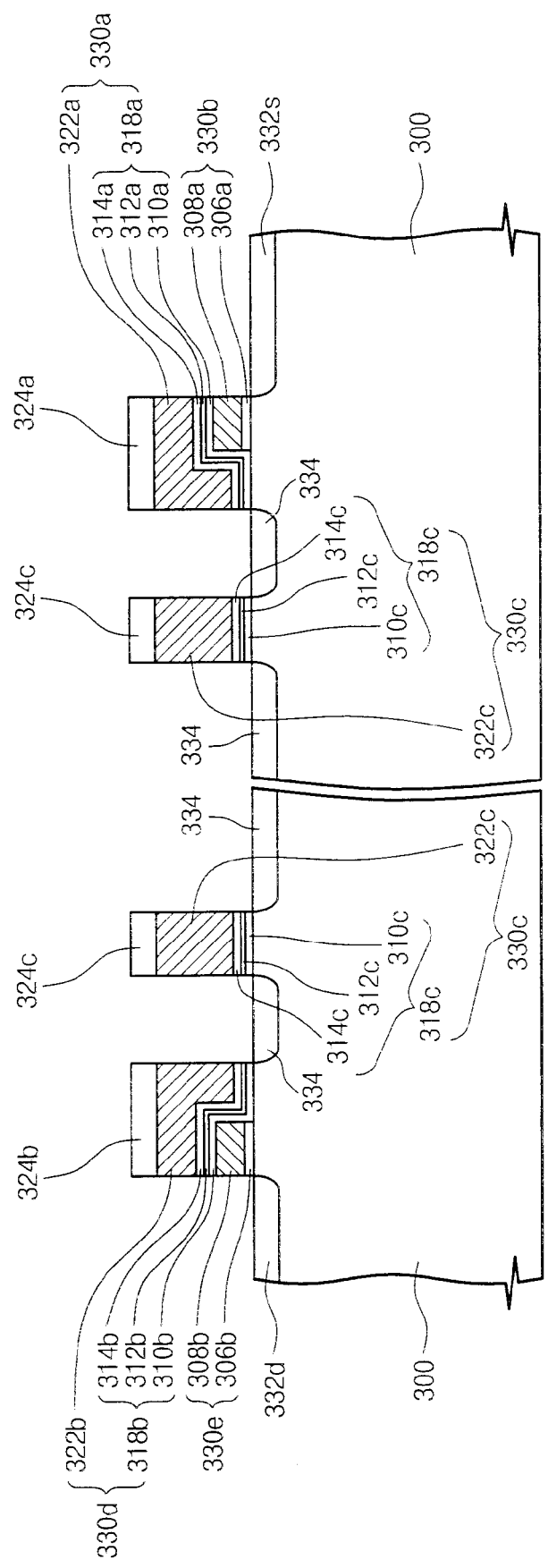

NAND FLASH MEMORY DEVICE AND METHODS OF ITS FORMATION AND OPERATION

CROSS-REFERENCE TO RELATED APPLICATIONS

This U.S. non-provisional patent application claims priority under 35 U.S.C. § 119 from Korean Patent Application 2005-34770 filed on Apr. 26, 2005, and Korean Patent Application 2005-38506 filed on May 9, 2005, the entire contents of which are hereby incorporated by reference.

BACKGROUND OF THE INVENTION

1. Field of the Invention

The present invention relates to a semiconductor device, and methods of forming and operating the same, and more particularly, to a NAND flash memory device and methods of forming and operating the same.

2. Description of the Related Art

Flash memory devices are non-volatile, maintaining stored data even when its power supply is interrupted. Also, flash memory devices can both write and erase data.

Among the family of flash memory devices, the NAND flash memory device has a plurality of memory cells that share a common source and a common drain, so it is very adaptable to high integration.

A general construction of the NAND flash memory device will now be described with reference to the accompanying drawings.

FIG. 1 is an equivalent circuit diagram of a NAND flash memory device according to the related art.

Referring to FIG. 1, the NAND flash memory device includes a plurality of cell strings arranged in parallel in a row direction. Each of the cell strings includes a plurality of memory cells 10 connected in series. Also, the cell strings include a ground selection transistor 20 connected in series to one end of each of the plurality of memory cells 10, and a string selection transistor 30 connected in series to the other end of each of the plurality of memory cells 10. The plurality of memory cells 10 are arranged in two dimensions, along row and column directions. Although not shown in the drawing, the memory cell 10 has a floating gate as a means of storing data.

Gates of the ground selection transistors 20 arranged in the column direction are connected to a ground selection line 'GSL', and gates of the string selection transistors 30 arranged in the column direction are connected to a string selection line 'SSL'. A plurality of word lines 'WL' are arranged between the ground selection lines 'GSL' and the string selection lines 'SSL'. Each of the plurality of word lines 'WL' is connected with (control) gates of the memory cells 10 arranged in the column direction. Source regions of the ground selection transistors 20 are connected to a common source line 'CSL'. The common source line 'CSL' is connected with the source regions of the plurality of ground selection transistors 20 arranged in the column direction. Drain regions of the string selection transistors 30 are connected to the bit line 'BL'. One bit line 'BL' is connected to each of the plurality of strings.

A programming operation for a selected cell 10s of the aforementioned related art NAND flash memory device will now be described. When a ground voltage is applied to the common source line 'CSL', a constant voltage is applied to the string selection line 'SSL', and a ground voltage is applied to the ground selection line 'GSL', the ground selection transistor 20 is turned off.

The ground voltage is applied to the selected bit line 'BL' connected to the selected cell 10s, and the constant voltage is applied to the non-selected bit lines 'BL'. A programming voltage is applied to the selected word line 'WL' connected to the selected cell 10s. At this time, a pass voltage is applied to the non-selected word lines 'WL'. The pass voltage is a voltage capable of turning on both the memory cell 10 storing data and the memory cell 10 not storing data. Accordingly, the ground voltage supplied to the selected bit line 'BL' is applied to a channel of the selected cell 10s, and the programming voltage applied to the selected word line 'WL' is applied to the gate of the selected cell 10s. As a result, electrons in the channel of the selected cell 10s tunnel through a tunnel insulation layer by Fowler Nordheim tunneling, and are then stored in a floating gate.

Meanwhile, a voltage obtained by subtracting a threshold voltage of the string selection transistor 30 from the constant voltage applied to the non-selected bit line 'BL' is applied to a channel region of the non-selected cell 10 connected to the selected word line 'WL'. By doing so, the string selection transistor 30 connected to the non-selected cell 10 is automatically turned off, so that the channel of the non-selected cell 10 is in floating state. As a result, when a high programming voltage is applied to the selected word line 'WL', the channel voltage of the non-selected cell 10 is boosted by a capacitor coupling. Accordingly, a voltage difference between the non-selected cell 10 and the selected word line 'WL' is decreased, so that the non-selected cell is prevented from being programmed.

However, as the channel voltage of the non-selected cell 10 is boosted, a leakage current may be generated between the drain region and the source region of the ground selection transistor 20 connected to the non-selected cell 10, which will be described with reference to FIG. 2.

FIG. 2 is a cross-sectional view of a NAND flash memory device according to the related art.

Referring to FIGS. 1 and 2, FIG. 2 shows the ground selection transistor 20 of the cell string having the non-selected cell 10 connected with the selected word line 'WL' and the memory cell adjacent to the ground selection transistor 20.

A cell gate line 2 and a ground selection gate line are disposed on a semiconductor substrate 1. Cell source/drain regions 4 and 4' are disposed in the semiconductor substrate 1 at both sides of the cell gate line 2. A common source region 5 is disposed in the semiconductor substrate 1 at one side of the ground selection gate line 3. The cell source/drain region 4' between the cell gate line 2 and the ground selection gate line 3 is shared by the memory cell 10 and the ground selection transistor 20. In other words, the cell source/drain region 4' corresponds to the drain region 4' of the ground selection transistor 20.

The boosted channel voltage of the non-selected cell 10 connected with the selected word line 'WL' can be applied to the drain region 4' of the ground selection transistor 20 via sources/drains of the neighboring memory cells 10. The boosted channel voltage may be considerably higher than the constant voltage. For example, when the programming voltage is about 18 V, the boosted channel voltage is about 8 V, which is considerably high. Accordingly, even when the ground selection transistor 20 is in an Off state, a punch-through phenomenon may be generated between the drain region 4' and the common source region 5. Also, drain induced barrier lowering (DIBL) phenomenon occurs in the ground selection transistor 20 by the boosted channel voltage, so that a leakage current may be generated between the drain region 4' and the common source region 5. Unfortunately, the leakage current thus generated decreases the boosted channel voltage, so that the non-selected cell 10 may be inadvertantly programmed.

Also, the high boosted channel voltage may degenerate the punch-through characteristic between the source and drain of the string selection transistor 30. Accordingly, a leakage current may be generated through the string selection transistor 30.

According to the high integration trend of semiconductor devices, line widths of ground selection gate lines 3 are continuously decreasing. To this end, the leakage current between the drain region 4' and the common source region 5 is becoming more serious.

SUMMARY OF THE INVENTION

Exemplary embodiments of the present invention provide a NAND flash memory device and methods of forming and operating the same that can minimize a leakage current.

Also, exemplary embodiments of the present invention provide a NAND flash memory device and methods of forming and operating the same that can minimize a leakage current due to a boosted channel voltage of a non-selected cell.

Further, exemplary embodiments of the present invention provide a NAND flash memory device suitable for high integration and methods of forming and operating the same that can minimize a leakage current.

In an embodiment, the NAND flash memory device may include a device isolation layer formed in a semiconductor substrate to define an active region; a cell gate group including a plurality of cell gate lines arranged in parallel with each other on the active region; a first selection gate line disposed on the active region of one side of the cell gate group, and including a first selection lower gate and a first selection upper gate sequentially stacked and connected with each other, and a first intergate pattern interposed between the first selection lower gate and the first selection upper gate; a second selection gate line disposed on the active region of one side of the first selection gate line, the first selection gate line disposed between the cell gate group and the second selection gate line; and first impurity diffusion layers respectively formed at the active region of both sides of the cell gate line, a second impurity diffusion layer formed at the active region between the first selection gate line and the second selection gate line, and a third impurity diffusion layer disposed at the active region of one side of the second selection gate line. The second selection gate line is disposed between the second and third impurity diffusion layer, and the third impurity diffusion layer is one of a common source region and a common drain region.

In another embodiment, the NAND flash memory device may include a cell group including a plurality of cell transistors connected in series; and a first selection transistor and a second selection transistor sequentially connected in series to one end of the cell group. Wherein a first channel region of the first selection transistor is directly connected with a second channel region of the second selection transistor, and the second selection transistor is connected with one of a bit line and a common source line.

In further another embodiment, the NAND flash memory device may include a device isolation layer formed in a semiconductor substrate to define an active region; a cell gate group including a plurality of cell gate lines arranged in parallel with each other on the active region; a first selection gate line disposed on the active region of one side of the cell gate group; a second selection gate line disposed on the active region of one side of the first selection gate line, the first selection gate line disposed between the cell gate group and the selection gate line; first impurity diffusion layers respectively formed at the active region of both sides of the cell gate line; and a second impurity diffusion layer disposed at the active region of one side of the second selection gate line and being opposite to the cell gate group. Wherein a first channel region below the first selection gate line is directly connected with a second channel region below the second selection gate line and the second impurity diffusion layer is one of a common source region and a common drain region.

In still another embodiment, the method may include forming a device isolation layer to define an active region in a semiconductor substrate; forming a cell gate group including a plurality of cell gate lines, a first selection gate line and a second selection gate line arranged in parallel with each other on the active region; and implanting impurity ions into the active region using the cell gate lines and the first and second selection gate lines as a mask to form impurity diffusion layers at the active region, wherein the first selection gate line comprises a first selection lower gate and a second selection upper gate sequentially stacked and connected with each other, and a first intergate pattern interposed between the first selection lower and upper gates.

In further still another embodiment, the method may include forming a device isolation layer in a semiconductor substrate to define an active region; forming a cell gate group, a first selection gate line and a second selection gate line, the cell gate group including a plurality of cell gate lines sequentially arranged in parallel on the active region; and implanting impurity ions using the cell gate lines and the first and second selection gate lines as a mask to form an impurity diffusion layer, wherein a first channel region below the first selection gate line is directly connected with a second channel region below the second selection gate line.

In yet still another embodiment of the present invention may provide a method of programming the NAND flash memory device including a plurality of cell transistors connected in series, and first and second ground selection transistors sequentially connected in series to one end of the plurality of cell transistors, wherein a channel region of the first ground selection transistor is directly connected with a channel region of the second ground selection transistor. The programming method may include applying a constant voltage to a gate of the first ground selection transistor; applying a ground voltage to a gate of the second ground selection transistor; and applying a programming voltage to a gate of a selected cell transistor.

Another embodiment of the present invention may provide a method of programming a NAND flash memory device including a plurality of cell transistors connected in series, and first and second string selection transistors sequentially connected in series to one end of the plurality of cell transistors, wherein a channel region of the first string selection transistor is directly connected with a channel region of the second string selection transistor. The programming method may include applying a constant voltage to a gate of the first string selection transistor; applying a ground voltage to a gate of the second string selection transistor; and applying a programming voltage to a gate of a selected cell transistor.

BRIEF DESCRIPTION OF THE DRAWINGS

The accompanying drawings, which are included to provide a further understanding of the invention, and are incorporated in and constitute a part of this application, illustrate embodiments of the invention, and together with the description, serve to explain the principle of the invention. In the drawings:

FIG. 4A is a cross-sectional view taken along the line I-I' of FIG. 3;

FIGS. 6A through 10A are cross-sectional views taken along I-I' of FIG. 3 to explain a method of forming a NAND flash memory device according to an embodiment of the present invention;

FIGS. 6B through 10B are cross-sectional views taken along the line II-II' of FIG. 4A to explain a method of forming a NAND flash memory device according to an embodiment of the present invention;

FIGS. 6C through 10C are cross-sectional views taken along the line III-III' of FIG. 4A to explain a method of forming a NAND flash memory device according to an embodiment of the present invention;

FIGS. 26A and 27A are cross-sectional views taken along the line VII-VII' of FIG. 24 to explain a method of forming the NAND flash memory device according to still another embodiment of the present invention;

DETAILED DESCRIPTION OF THE INVENTION

Figure 1:
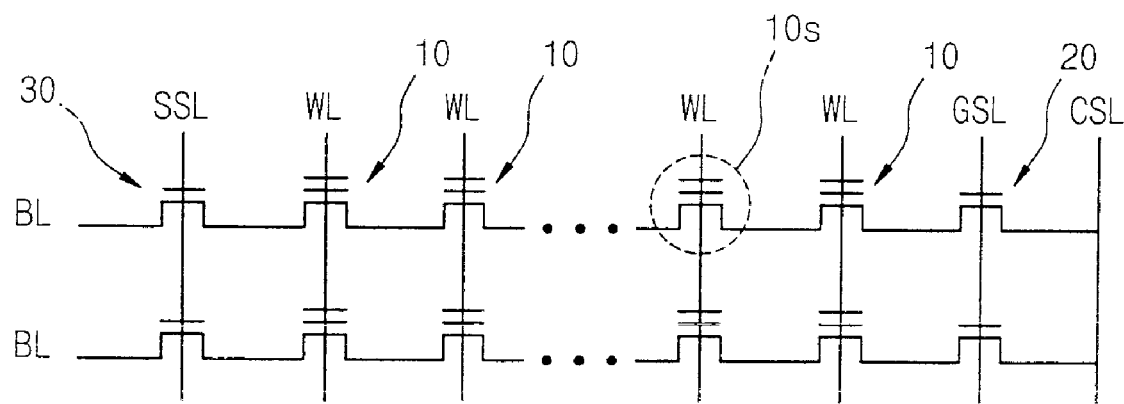
FIG. 1 is an equivalent circuit diagram of a NAND flash memory device according to the related art.
Figure 2:
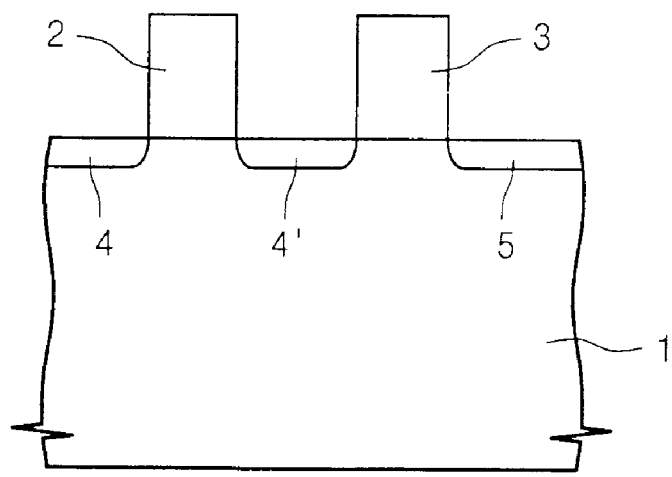
FIG. 2 is a cross-sectional view of a NAND flash memory device according to the related art.

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the thicknesses of layers and regions are exaggerated for clarity. It will also be understood that when a layer is referred to as being "on" another layer or substrate, it can be directly on the other layer or substrate, or intervening layers may also be present. Like reference numerals in the drawings denote like elements, and thus their description will be omitted.

FIRST EMBODIMENT

Figure 3:
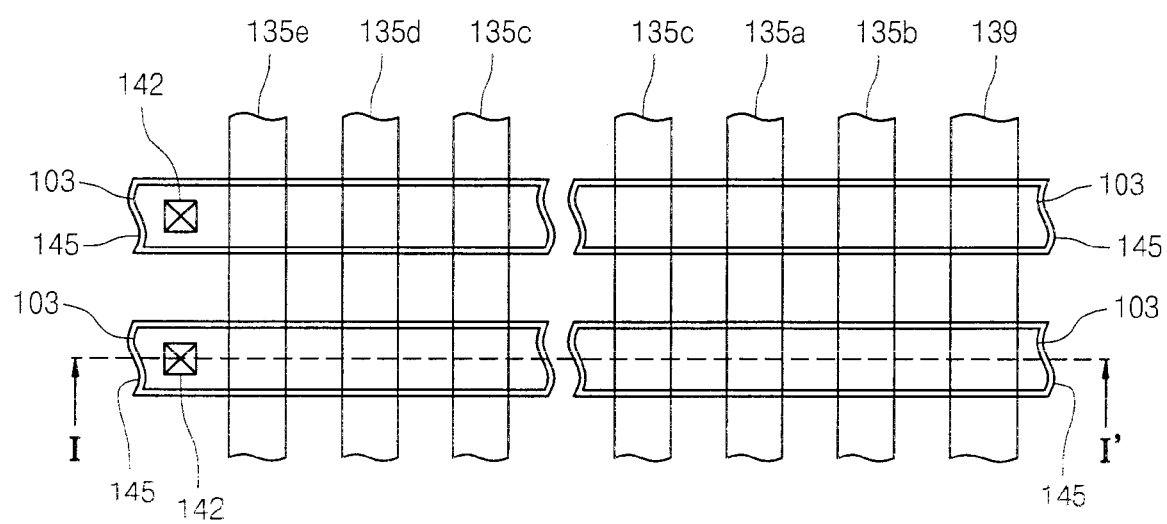
FIG. 3 is a plan view of a NAND flash memory device according to an embodiment of the present invention.
Figure 4B:
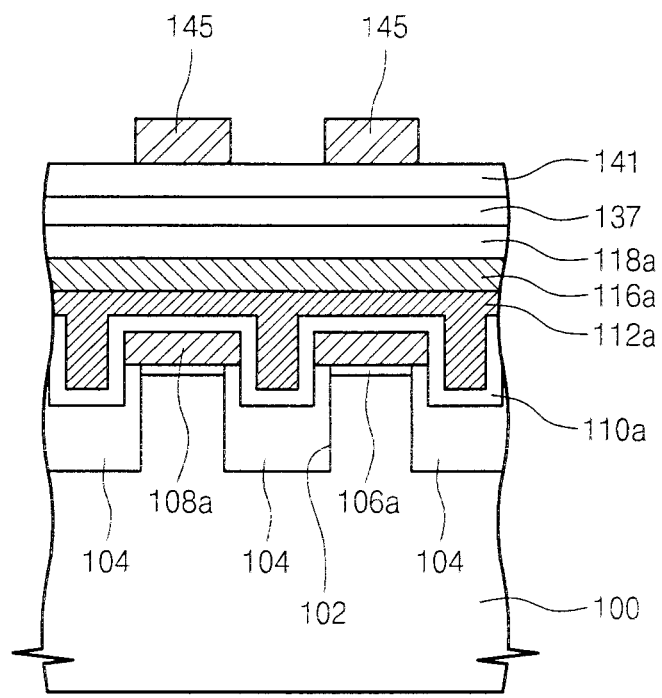
FIGS. 4B and 4C are cross-sectional views taken along the lines II-II' and III-III' of FIG. 4A, respectively.
Figure 4C:
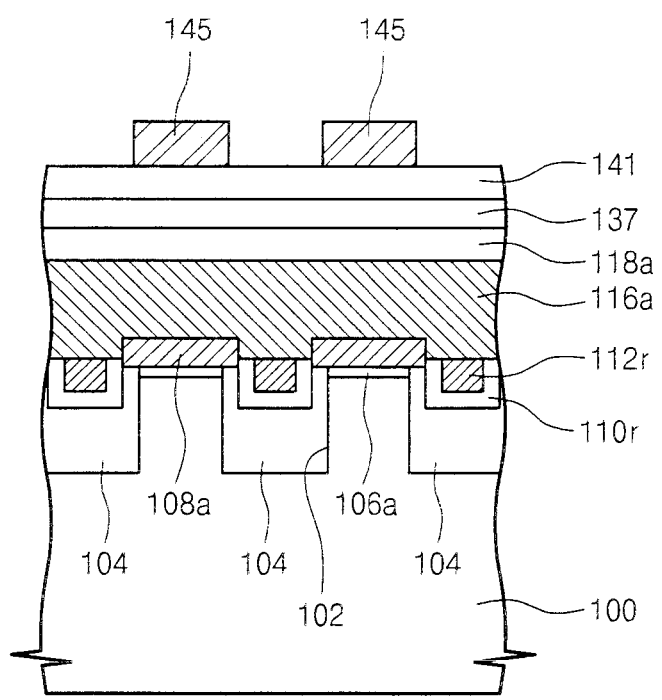

FIG. 3 is a plan view of a NAND flash memory device according to an embodiment of the present invention, FIG. 4A is a cross-sectional view taken along the line I-I' of FIG. 3, and FIGS. 4B and 4C are cross-sectional views taken along the lines II-II' and III-III' of FIG. 4A, respectively.

Referring to FIGS. 3, and 4A through 4C, a device isolation layer 104 defining active regions 103 is disposed at a predetermined region of a semiconductor substrate 100. The active regions 103 are disposed in parallel with one another. The active regions 103 may be line-shaped. The device isolation layer 104 may fill a trench 102 formed in the semiconductor substrate 100. In other words, the device isolation layer 104 can be a trench type device isolation layer.

A plurality of cell gate lines 135c cross over the active regions 103. The plurality of cell gate lines 135c constitute a cell gate group. A first ground selection gate line 135a crosses over the active regions 103 disposed at one side of the cell gate group. A second ground selection gate line 135b is disposed at one side of the first ground selection gate line 135a and crosses over the active regions 103 disposed at an opposite side from the cell gate group. In other words, the first and second ground selection gate lines 135a and 135b are disposed at one side of the cell gate group, and are spaced apart from each other. The first ground selection gate line 135a is disposed between the cell gate group and the second ground selection gate line 135b.

A first string selection gate line 135d is disposed on the active region of the other side of the cell gate group. The cell gate group is disposed between the first ground selection gate line 135a and the first string selection gate line 135d. A second string selection gate line 135e is disposed at one side of the first string selection gate line 135d and crosses over the active regions 103 disposed at an opposite side of the cell gate group. The first string selection gate line 135d is disposed between the cell gate group and the second string gate line 135e. The first and second string selection gate lines 135d and 135e are spaced apart from each other.

In other words, the plurality of cell gate lines 135c cross over the active regions 103 between the first ground selection gate line 135a and the first string selection gate lines 135d in parallel, and the first ground selection gate line 135a, the plurality of cell gate lines 135c and the first string selection gate line 135d cross over the active regions 103 between the second ground selection gate line 135b and the second string selection gate line 135e in parallel.

The aforementioned flash memory device includes one pair of ground selection gate lines 135a and 135b, and one pair of string selection gate lines 135d and 135e. Alternatively, a flash memory device according to the present invention may include one pair of ground selection gate lines 135a and 135b, and one string selection gate line. Alternatively, a flash memory device according to the present invention may include one pair of string selection gate lines 135d and 135e and one ground selection gate line.

The cell gate line 135c includes a tunnel insulation pattern 106c, a floating gate 108c, a blocking insulation pattern 110c, and a control gate electrode 120 sequentially stacked. The control gate electrode 120 crosses over the active region 103 and the floating gate 108c is interposed between the active region 103 and the control gate electrode 120. The tunnel insulation pattern 106c is interposed between the active region 103 and the floating gate 108c, and the blocking insulation pattern 110c is interposed between the floating gate 108c and the control gate electrode 120. By doing so, the floating gate 108c is electrically isolated. Of course, the floating gate is isolated from the neighboring other floating gates 108c.

The tunnel insulation pattern 106c can be made of a silicon oxide, in particular, a thermal oxide. The floating gate 108c can be made of a doped polysilicon that is a conductor. The blocking insulation pattern 110c can be made of an ONO layer. Alternatively, the blocking insulation pattern may be made of an insulator having a higher dielectric constant than the tunnel insulation pattern 106c. For example, the blocking insulation pattern 110c can be made of an insulator, such as hafnium oxide, aluminum oxide, or the like. The control gate electrode 120 is made of a conductor. Especially, the control lower gate 112c can be made of a conductor capable of protecting the blocking insulation pattern 110c from etch damage, for example, a doped polysilicon, or a conductive metal nitride (for example, titanium nitride, tantalum nitride, etc.). The control upper gate 116c includes a conductor. For example, the control upper gate 116c can include at least one selected from the group consisting of a doped polysilicon, a metal (for example, tungsten (W), molybdenum (Mo), etc.) and a metal silicide (for example, tungsten silicide, cobalt silicide, etc.).

The ground selection gate line 135a includes a first insulation pattern 106a, a first ground selection lower gate 108a and a first ground selection upper gate 116. Also, the first ground selection gate line 135a further includes a first ground intergate pattern interposed between the first ground selection lower and upper gates 108a and 116a. At this time, the first ground selection lower and upper gates 108a and 116a are electrically connected with each other. The first ground selection intergate pattern can be comprised of a lower portion 110a and an upper portion 112a.

The first ground selection intergate pattern has a width that is narrower than that of each of the first ground selection lower and upper gates 108a and 116a. Therefore, an upper surface of the first ground selection lower gate 108a contacts the first ground selection intergate pattern and the first ground selection upper gate 116a simultaneously.

The first ground selection lower gate 108a, the first ground selection intergate pattern and the first ground selection upper gate 116a have first sidewalls adjacent to the cell gate line 135c and second sidewalls disposed at an opposite side of the first sidewalls. The first sidewall of the first ground selection upper gate 116a, the first sidewall of the first ground selection intergate pattern and the first sidewall of the first ground selection lower gate 108a are aligned with one another. The first ground selection upper gate 116a covers the second sidewall of the first ground selection intergate pattern. Also, the first ground selection upper gate 116a partially contacts an upper surface of the first ground selection lower gate 108a disposed next to the second sidewall of the first ground selection intergate pattern. It is preferable that the second sidewall of the first ground selection lower gate 108a be aligned with the second sidewall of the first ground selection upper gate 116a.

The first ground selection lower gate 108a is preferably made of the same material as that of the floating gate 108c. The first ground selection lower gate 108a can be disposed on the active region 103 similarly to the floating gate 108c. In other words, the plurality of first ground selection lower gates 108 can be respectively disposed on the active regions 103 along the first ground selection gate line 135a. At this time, the plurality of first ground selection lower gates 108a are spaced apart from each other. Of course, the plurality of first ground selection lower gates 108a are connected with the first ground selection upper gate 116a.

It is preferable that the first ground selection upper gate 116a be made of the same material as the control upper gate 116c. It is preferable that the first ground selection intergate pattern be made of the same material as the blocking insulation pattern 10c and the control lower gate 112c. Specifically, the lower portion of the first ground selection intergate pattern is made of the same material as the blocking insulation material, and the upper portion 112a of the first ground selection gate pattern is made of the same material as the control lower gate 112c. The first insulation pattern 106a can be made of a silicon oxide. The first insulation pattern 106a may be the same material as the tunnel insulation material.

The upper surface of the device isolation layer 104 is lower than an upper surface of the semiconductor substrate 100. Therefore, the upper surface of the device isolation layer 104 forms a recessed portion. As shown in FIG. 4B, the first ground selection intergate pattern can extend to partially fill the recessed portion. At this time, as shown in FIG. 4C, a remaining pattern can be disposed at a portion other than the recessed portion positioned at one side of the extending portion of the first ground selection intergate pattern. The remaining pattern includes a lower remaining layer 110r and an upper remaining layer 112r sequentially stacked. A part of the first ground selection upper gate 116a contacting the first ground selection lower gate 108a extends over the remaining pattern. The remaining pattern can be made of the same material as the first ground selection intergate pattern. In other words, the lower remaining layer 110r and the upper remaining layer 112r can be made of the same material as the lower portion 110a and the upper portion 112a of the first ground selection intergate pattern.

The second ground selection gate line 135b includes a second insulation pattern 106b, a second ground selection lower gate 108b and a second ground selection upper gate 116b, sequentially stacked. Also, the second ground selection gate line 135b can further include a second ground selection intergate pattern interposed between the second ground selection lower and upper gates 108b and 116b. At this time, the second ground selection lower and upper gates 108b and 116b are electrically connected with each other. The second ground selection intergate pattern is also comprised of a lower portion 110b and an upper portion 112b.

The second ground selection gate line 135b can be symmetric to the first ground selection gate line 135a. The width of the second ground selection intergate pattern is narrower than the widths of the second ground selection lower and upper gates 108b and 116b. Therefore, the upper surface of the second ground selection lower gate 108b simultaneously contacts the second ground selection intergate pattern and the second ground selection upper gate 116b.

The second ground selection lower gate 108b, the second ground selection intergate pattern, and the second ground selection upper gate 116b have first sidewalls adjacent to the first ground selection gate line 135a, and second sidewalls disposed at an opposite side of the first sidewalls, respectively. The first sidewall of the second ground selection lower gate 108b, the second sidewall of the second ground selection intergate pattern, and the second sidewall of the second ground selection upper gate 116b are aligned with one another. The second ground selection upper gate 116b contacts the first sidewall of the second ground selection intergate pattern and a part of an upper surface of the second ground selection lower gate 108b. The first sidewall of the second ground selection lower gate 108b is aligned with the first sidewall of the second ground selection upper gate 116b.

The second ground selection lower and upper gates 108b and 116b are made of the same material as the first ground selection lower and upper gates 108a and 116a, and the second ground selection intergate pattern is made of the same material as the first ground selection intergate pattern. In other words, the lower portion 110b and the upper portion 112b of the second ground selection intergate pattern are made of the same material the lower portion 110a and the upper portion 112a of the first ground selection intergate pattern. The second insulation pattern 106b can be made of a silicon oxide. The second insulation pattern 106b can be made of the same material as the first insulation pattern 106a.

Similarly to the first ground selection intergate pattern, the second ground selection intergate pattern can extend to fill the recessed portion of the device isolation layer 104. Also, a part of the second ground selection upper gate 116b contacting the second ground selection lower gate 108b can extend over the remaining pattern formed on a part of the recessed portion.

It is preferable that the first string selection gate line 135d be symmetric to the first ground selection gate line 135a. The first string selection gate line 135d includes a third insulation pattern 106d, a first string selection lower gate 108d, and a first string selection upper gate 116d. The first string selection lower and upper gates 108d and 116d are in contact with each other. Also, the first string selection gate line 135d further includes a first string selection intergate pattern interposed between the first string selection lower and upper gates 108d and 116d. The first string selection intergate pattern is comprised of a lower portion 110d and an upper portion 112d. It is preferable that a width of the first string selection intergate pattern be narrower than widths of the first string selection lower and upper gates 108d and 116d. An upper surface of the first string selection lower gate 108d simultaneously contacts the first string selection intergate pattern and the first string selection upper gate 116d.

The first string selection lower gate 108d, the first string selection intergate pattern, and the first string selection upper gate 116d have first sidewalls adjacent to the cell gate group, and second sidewalls disposed at an opposite side of the first sidewalls. It is preferable that the first sidewall of the first string selection lower gate 108d, the first sidewall of the first string selection intergate pattern, and the first sidewall of the first string selection upper gate 116d be aligned with one another. The first string selection upper gate 116d contacts the second sidewall of the first string selection intergate pattern and a part of an upper surface of the first string selection lower gate 108d disposed adjacent to the second sidewall of the first string selection intergate pattern. The second sidewalls of the first string selection lower and upper gates 108d and 116d are aligned with each other.

The first string selection intergate pattern can extend to partially fill the recessed portion of the device isolation layer 104. A part of the first string selection upper gate 116d contacting the first string selection lower gate 108d can extend over the remaining pattern formed in the recessed portion of the device isolation layer 104.

It is preferable that the first string selection lower and upper gates 108d and 116d be made of the same material as the first ground selection lower and upper gates 108a and 116a and the first string selection intergate pattern be made of the same material as the first ground selection intergate pattern. The third insulation pattern 106d can be made of a silicon oxide. The third insulation pattern 106d can be made of the same material as the first insulation pattern 106a.

It is preferable that the second string selection gate line 135e be symmetric to the second ground selection gate line 135b. In other words, the second string selection gate line 135e includes a fourth insulation pattern 106e, a second string selection lower gate 108e, and a second string selection upper gate 116e. Also, the second string selection gate line 135e further includes a second string selection intergate pattern interposed between the second string selection lower and upper gates 108e and 116e. The second string selection intergate pattern is comprised of a lower portion 110e and an upper portion 112e.

The second string selection lower gate 108e, the second string selection intergate pattern and the second string selection upper gate 116e have first sidewalls adjacent to the first string selection gate line 135d, and second sidewalls disposed at an opposite side of the first sidewalls, respectively. The second sidewall of the second string selection lower gate 108e, the second sidewall of the second string selection intergate pattern and the second sidewall of the second string selection upper gate 116e are aligned with one another. The second string selection upper gate 116e contacts the first sidewall of the second string selection intergate pattern and a part of an upper surface of the second string selection lower gate 108e. The first sidewall of the second string selection lower gate 108e is aligned with the first sidewall of the second string selection upper gate 116e.

The second string selection intergate pattern can extend to fill the recessed portion of the device isolation layer 104. Also, a part of the second string selection upper gate 116e contacting the second string selection lower gate 108e can extend over the remaining pattern formed on a part of the recessed portion.

A first ground selection capping pattern 118a is disposed on the first ground selection gate line 135a, and a second ground selection capping pattern 118b is disposed on the second ground selection gate line 135b. A cell capping pattern 118c is disposed on the cell gate line 135c, and a first string selection capping pattern 118d and a second string selection capping pattern 118e are respectively disposed on the first and second string selection gate lines 135d and 135e. The capping patterns 118a, 118b, 118c, 118d and 118e can be made of a silicon nitride.

Impurity diffusion layers 124s, 124d, 126, 128 and 130 are formed in the active region 103 at both sides of the gate lines 135a, 135b, 135c, 135d and 135e.

The first impurity diffusion layer 124s is formed in the active region which is disposed at one side of the second ground selection gate line 135b and is an opposite side of the first ground selection gate line 135a. The first impurity diffusion layer 124s corresponds to a common source region. The second impurity diffusion layer 124d is formed in the active region which is disposed at one side of the second string selection gate line 135e and is an opposite side of the first string selection gate line 135d. The second impurity diffusion layer 124d corresponds to a common drain region. The third impurity diffusion layer 126 is disposed at both sides of the cell gate line 135c, and the fourth impurity diffusion layer 128 is disposed between the first and second ground selection gate lines 135a and 135b. The fifth impurity diffusion layer 130 is disposed between the first and second string selection gate lines 135d and 135e.

The cell gate line 135c and the third impurity diffusion layer 126 positioned at both sides thereof constitute a cell transistor. The first ground selection gate line 135a and the third and fourth impurity diffusion layers 126 and 128 positioned at both sides thereof constitute a first ground selection transistor, and the second ground selection gate line 135b and the fourth and first impurity diffusion layers 128 and 124s positioned at both sides thereof constitute a second ground selection transistor. The first string selection gate line 135d and the fifth and third impurity diffusion layers 130 and 126 positioned at both sides thereof constitute a first string selection transistor, and the second string selection gate line 135e and the second and fifth impurity diffusion layers 124d and 130 positioned at both sides thereof constitute a second string selection transistor. The first impurity diffusion layer 124s corresponds to the common source region 124s, and the second impurity diffusion layer 124d corresponds to the common drain region 124d.

The cell gate line corresponds to the word line, and the first and second ground selection gate lines 135a and 135b correspond to the first ground selection line and the second ground selection line, respectively. The first and second string selection gate lines 135d and 135e correspond to the first string selection line and the second string selection line, respectively.

In other words, the plurality of cell transistors are connected in series, and the first and second ground selection transistors are sequentially connected in series to ends of each of the plurality of cell transistors. The first and second string selection transistors are sequentially connected in series to the other ends of each of the plurality of cell transistors.

Alternatively, although not shown in the drawings, a NAND flash memory device according to the present invention may include the first and second ground selection transistors and one string selection transistor. Alternatively, a NAND flash memory device according to the present invention may include the first and second string selection transistors and one ground selection transistor.

A first interlayer insulating layer 137 covers an entire surface of the semiconductor substrate 100. The first interlayer insulating layer 137 can be made of a silicon oxide, in particular, a CVD silicon oxide. A common source line 139 penetrates the first interlayer insulating layer 137 to fill a groove exposing the common source region 124s. The common source line 139 can intersect the plurality of active regions 103. Therefore, the common source line 139 can be connected with the plurality of common source regions 124s formed in the plurality of active regions 103. The common source line 139 is made of a conductor. For example, the common source line 139 can include at least one selected from the group consisting of a doped polysilicon, a conductive metal nitride (for example, titanium nitride, tantalum nitride), a metal (for example, tungsten, molybdenum or the like), and a metal silicide (for example, tungsten silicide, cobalt silicide or the like).

A second interlayer insulating layer 141 covers an entire surface of the semiconductor substrate 100 having the first interlayer insulating layer 137 and the common source line 139. The second interlayer insulating layer 141 can be made of a silicon oxide, in particular, a CVD silicon oxide. A contact plug 143 sequentially penetrates the second and first interlayer insulating layers 141 and 137 to fill a bit line contact hole 142 exposing the common drain region 124d. The contact plug 143 is made of a conductor.

A bit line 145 connected with the contact plug 143 is disposed on the second interlayer insulating layer 141. The bit line 145 crosses the gate lines 135a, 135b, 135c, 135d and 135e. One bit line 145 is connected with one common drain region 124d. Accordingly, the plurality of bit lines 145 respectively corresponding to the active regions 103 are disposed in parallel on the second interlayer insulating layer 141.

A programming method of the NAND flash memory device having the aforementioned construction will now be described with reference to the accompanying drawings.

A ground voltage is applied to the common source line 139 and the gates 108b and 116b of the second ground selection gate line 135b. A constant voltage Vcc is applied to the gates 108a and 116a of the first ground selection gate line 135a. Accordingly, the second ground selection transistor is turned off.

The constant voltage is applied to the gates 108d and 116d of the first string selection gate line 135d and the gates 108e and 116e of the second string selection gate line 135e. A programming voltage is applied to the control gate electrode 120 of the cell gate line 135c connected to the selected cell transistor, and the ground voltage is applied to the bit line 145 connected to the selected cell transistor. At this time, the constant voltage is applied to the non-selected bit lines 145 and a pass voltage is applied to the control gate electrodes 120 of the non-selected cell gate lines 135c. Accordingly, the ground voltage is applied to the channel region of the non-selected cell transistor. As a result, the programming voltage is applied between the control gate electrode 120 of the selected cell transistor and the channel region to program the selected cell transistor.

Meanwhile, the channel region of the non-selected cell transistor (hereinafter referred to as 'non-selected cell') connected to the cell gate line 135a to which the programming voltage is applied is applied with the constant voltage applied to the non-selected bit lines 145. In detail, a voltage obtained by subtracting a threshold voltage of the second string selection transistor from the constant voltage can be applied to the channel region of the non-selected cell. Accordingly, the first and second string selection transistors connected to the non-selected cell are automatically turned off, so that the channel region of the non-selected cell is floated. As a result, when a high programming voltage is applied to the cell gate line 135a, the channel region of the non-selected cell is boosted to prevent the non-selected cell from being programmed.

The high boosted channel voltage of the non-selected cell is applied to the drain region of the first ground selection transistor connected to the non-selected cell via the neighboring cell transistors. At this time, the gate of the first ground selection transistor is applied with the constant voltage. Accordingly, while the high boosted channel voltage is applied to the drain of the first ground selection transistor, a voltage obtained by subtracting a threshold voltage of the first ground selection transistor from the constant voltage is induced to the source (i.e., fourth impurity diffusion layer 128) of the first ground selection transistor. As a result, the first ground selection transistor is automatically turned off. Resultantly, as a voltage (i.e., voltage obtained by subtracting the threshold voltage of the first ground selection transistor from the constant voltage) lower than the constant voltage is applied to the drain (i.e., fourth impurity diffusion layer 128) of the second ground selection transistor connected to the non-selected cell, a punch-through characteristic between the drain of the second ground selection transistor and the common source region 124s can be enhanced. By doing so, the leakage current caused by the boosted channel voltage of the non-selected cell can be prevented.

Also, the boosted channel voltage can be applied to the source (i.e., third impurity diffusion layer 126) of the first string selection transistor. At this time, the first string selection transistor functions as a buffer for the boosted channel voltage. Though a leakage current is generated between the source and drain of the first string selection transistor due to the boosted channel voltage, the voltage of the drain of the first string selection transistor is elevated due to the leakage current, which causes the voltage of the source of the second string selection transistor to be limitedly elevated. Accordingly, the leakage current through the second string selection transistor is minimized.

In the NAND flash memory device having the aforementioned construction, the first ground selection transistor including the first ground selection gate line 135a decreases the high boosted channel voltage of the non-selected cell. Therefore, a voltage difference between the drain and source (i.e., the common source region 124s) of the second ground selection transistor is decreased, so that the punch-through characteristic is enhanced. Also, since the voltage lower than the constant voltage is induced to the drain of the second ground selection transistor, the DBL phenomenon mentioned in the related art can be minimized. As a result, the leakage current of the NAND flash memory device can be minimized.

Also, since the first string selection transistor including the first string selection gate line 135d functions as a buffer for the boosted channel voltage, the leakage current through the second string selection transistor including the second string selection gate line 135e is minimized.

In addition, the first ground selection intergate pattern is disposed leaning toward an edge of an upper surface of the first ground selection lower gate 108a. Also, the second sidewall of the first ground selection lower gate 108a is aligned with the second sidewall of the first ground selection upper gate 116a. By doing so, the first ground selection gate line 135a has a minimum line width within the design rule, and can be connected with the first ground selection lower and upper gates 108a and 116a.

The second ground selection gate line 135b is symmetric to the first ground selection gate line 135a, and the first and second string selection gate lines 135d and 135e are respectively symmetric to the first and second ground selection gate lines 135a and 135b. Accordingly, the second ground selection gate line 135b and the first and second string selection gate lines 135d and 135e have a minimum line width within the design rule, and their lower gates 108b, 108d and 108e can be connected to the upper gates 116b, 116d and 116e, respectively. As a result, a highly integrated NAND flash memory device can be realized.

Meanwhile, the second ground selection gate line 135b may have a different structure, which will be described with reference to FIG. 5. A NAND flash memory device of the present modified example is similar to the aforementioned NAND flash memory device. Accordingly, like reference numerals in the drawings denote like elements.

Figure 5:
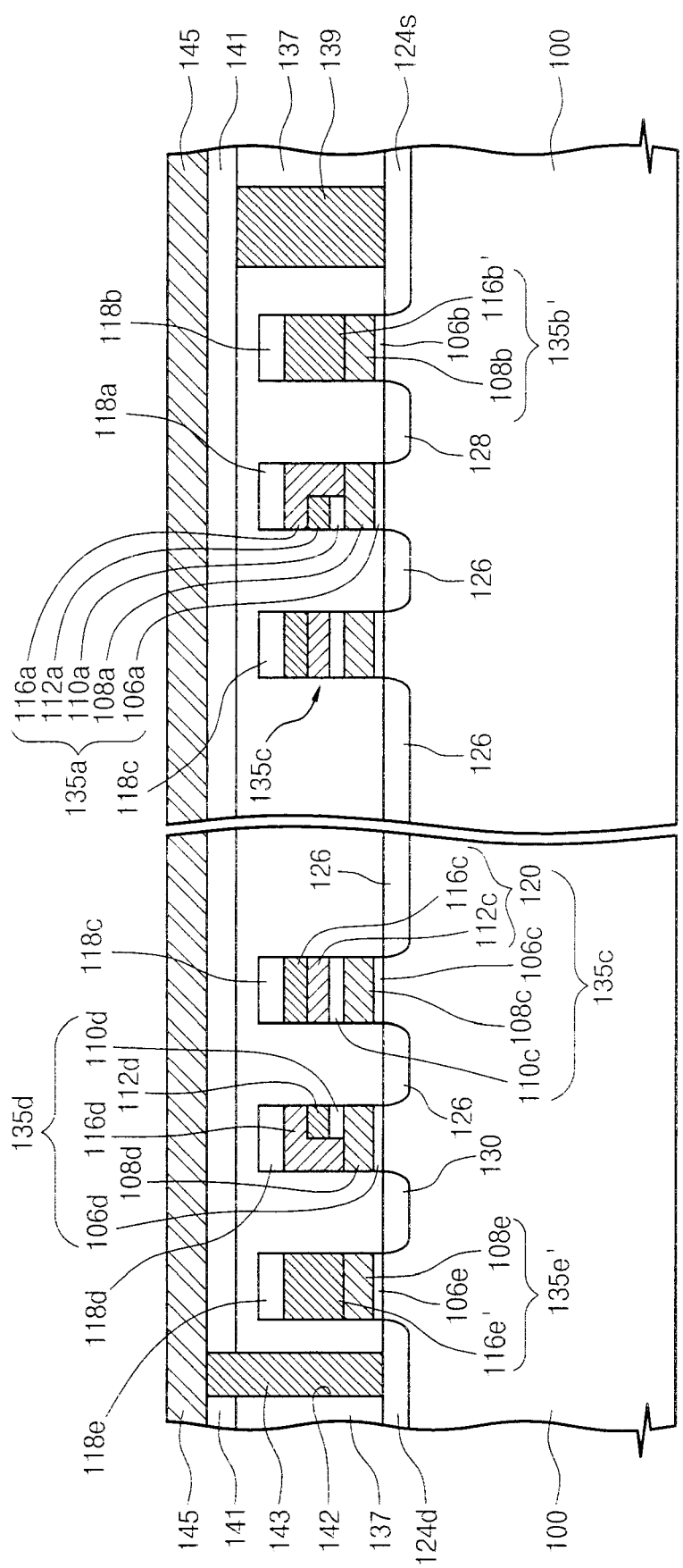
FIG. 5 is a cross-sectional view showing a modification of the NAND type flash memory device according to an embodiment of the present invention.

FIG. 5 is a cross-sectional view showing a modification of the NAND type flash memory device according to an embodiment of the present invention.

Referring to FIG. 5, a second ground selection gate line 135b' is disposed at one side of a first ground selection gate line 135a. The second ground selection gate line 135b' is disposed on an active region of an opposite side of a cell gate group including cell gate lines 135c. The first and second ground selection gate lines 135a and 135b' are spaced apart from each other.

The second ground selection gate line 135b' includes a second insulation pattern 106b, a second ground selection lower gate 108b and a second ground selection upper gate 116b' sequentially stacked. At this time, the second ground selection upper gate 116b' contacts an entire upper surface of the second ground selection lower gate 108b. In other words, the second ground selection intergate pattern shown in FIG. 4 is not required between the second ground selection upper gate 116b' and the second ground selection lower gate 108b.

The second string selection gate line 135e' is disposed at one side of the first string selection gate line 135d and on the active region of the opposite side of the cell gate group. It is preferable that the second string selection gate line 135e' be symmetric to the second ground selection gate line 135b'. The second string selection gate line 135e' includes a fourth insulation pattern 106e, a second string selection lower gate 108e and a second string selection upper gate 116e' sequentially stacked. The second string selection upper gate 116e' contacts an entire upper surface of the second string selection lower gate 108e. Likewise, the second string selection gate line 135e' does not require the second string selection intergate pattern shown in FIG. 4A.

FIGS. 6A through 10A are cross-sectional views taken along I-I' of FIG. 3 to explain a method of forming a NAND flash memory device according to an embodiment of the present invention, FIGS. 6B through 10B are cross-sectional views taken along the line II-II' of FIG. 4A to explain a method of forming a NAND flash memory device according to an embodiment of the present invention, and FIGS. 6C through 10C are cross-sectional views taken along the line III-III' of FIG. 4A to explain a method of forming a NAND flash memory device according to an embodiment of the present invention.

Figure 6A:
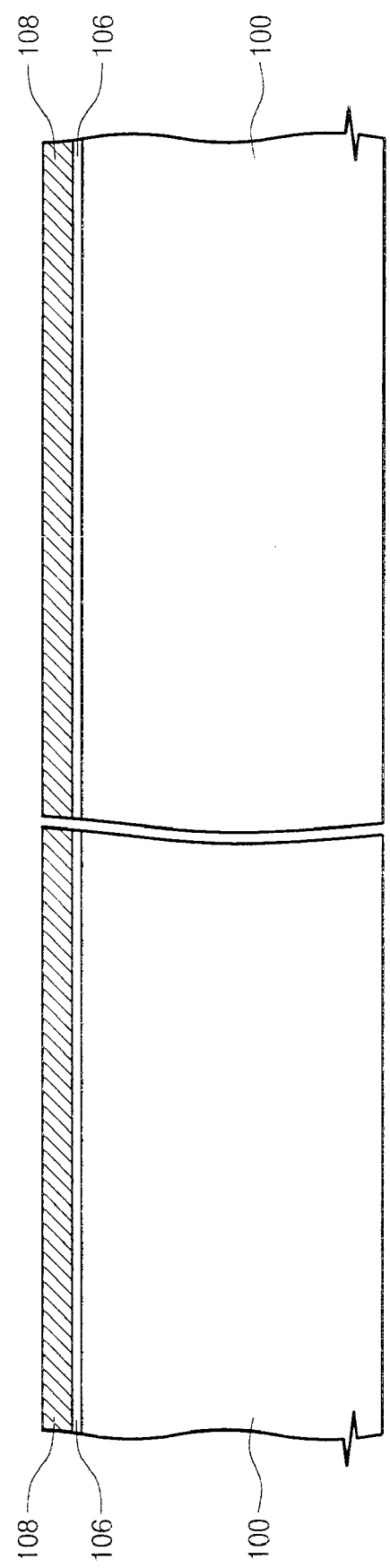
Figure 6B:
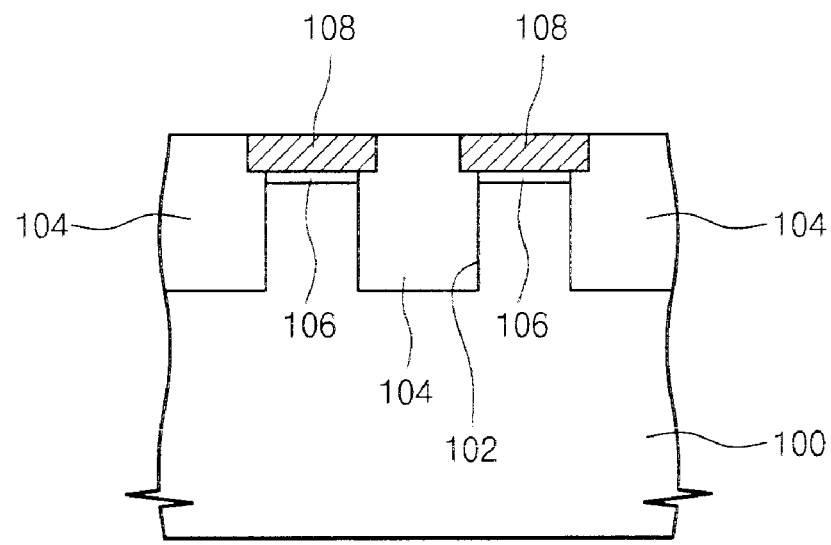
Figure 6C:
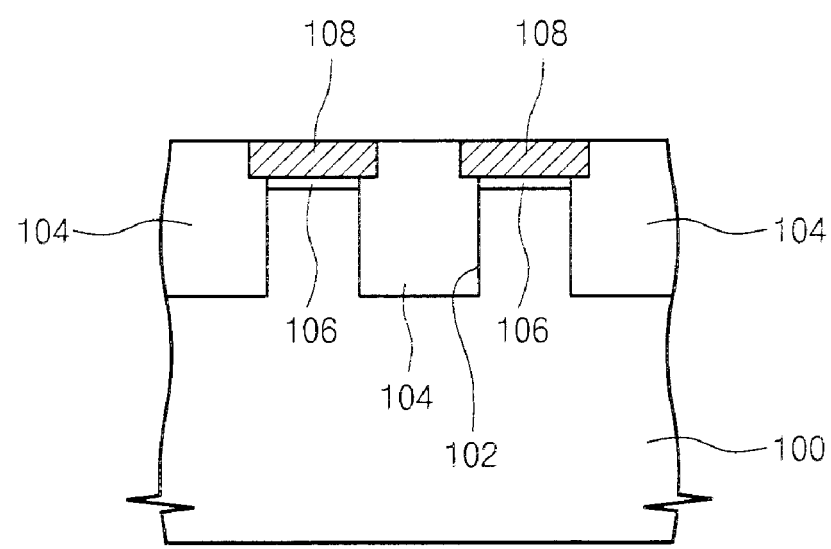

Referring to FIGS. 6A, 6B and 6C, a trench 102 defining the active regions 103 of FIG. 3 is formed at a predetermined portion of the semiconductor substrate 100, and a device isolation layer 104 filling the trench 102 is formed.

An upper portion of the device isolation layer 104 can be formed to protrude from an upper surface of the semiconductor substrate 100. A gate insulation layer 106 is formed on the semiconductor substrate 100, and a preliminary floating gate 108 covering the active region is formed on the gate insulation layer 106. The gate insulation layer 106 can be formed of a silicon oxide, in particular, a thermal oxide. The preliminary floating gate 108 can be formed of a doped polysilicon.

The preliminary floating gate 108 can be formed by the following process. A floating gate conductive layer is formed on an entire surface of the semiconductor substrate 100 having the gate insulation layer 104. The floating gate conductive layer fills a hollow region enclosed by protruded portions of the device isolation layer 106. Thereafter, the floating gate conductive layer is planarized until the protruded portions of the device isolation layer 106 are exposed, thereby forming the preliminary floating gate 108. The hollow region can be widened prior to forming the preliminary floating gate 108, isotropically etching the protruded portions of the device isolation layer 104. By the above process, the preliminary floating gate 108 is formed on the active region in a self-alignment way.

Alternatively, the preliminary floating gate 108 may be formed by depositing the floating gate conductive layer and patterning the deposited floating gate conductive layer.

Figure 7B:
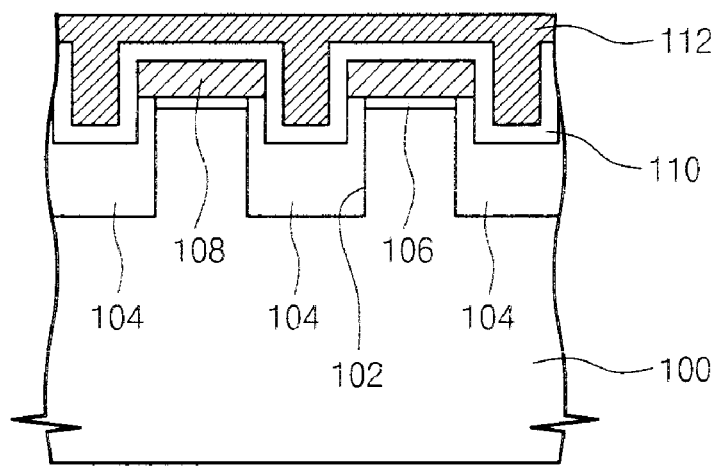
Figure 7C:
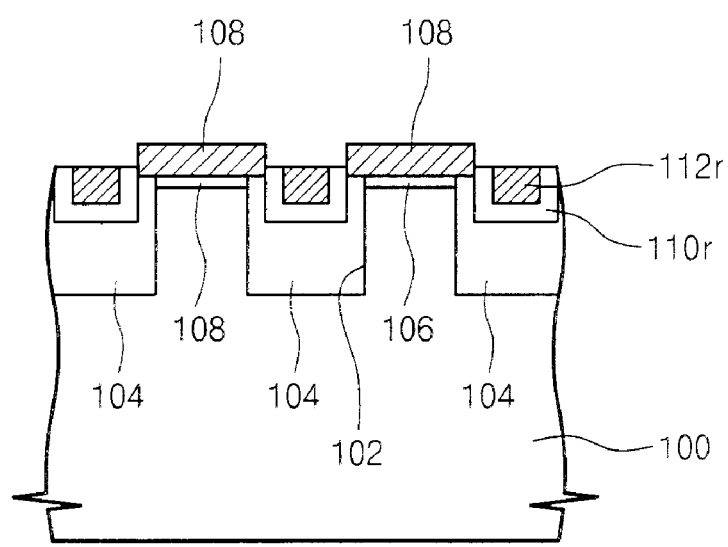

Referring to FIGS. 7A, 7B and 7C, the exposed device isolation layer 104 is recessed to expose sidewalls of the preliminary floating gate 108. Thereafter, a blocking insulation layer 110 and a first conductive layer 112 are sequentially formed on an entire surface of the semiconductor substrate 100. At this time, the blocking insulation layer 110 and the first conductive layer 112 fill the recessed portions of the device isolation layer 104.

The blocking insulation layer 110 can be made of an ONO layer. Alternatively, the blocking insulation layer 110 may be formed of a material having a higher dielectric constant compared with the gate insulation layer 106. For example, the blocking insulation layer 110 can be formed of a metal oxide insulator, such as hafnium oxide, aluminum oxide or the like. The first conductive layer 112 can be formed of a conductor capable of preventing an etch damage of the blocking insulation layer 110. For example, the first conductive layer 112 can be formed of a doped polysilicon, or a conductive metal nitride (for example, titanium nitride, tantalum nitride or the like).

A first groove 114a and a second groove 114b exposing predetermined portions of the preliminary floating gate 108 are formed by patterning the first conductive layer 112 and the blocking insulation layer 110. The first groove 114a is spaced apart from the second groove 114b. The first and second grooves 114a and 114b can cross the active region and the preliminary floating gate 108. The first groove 114a is formed at a region where ground selection gate lines are formed in a subsequent process, and the second groove 114b is formed at a region where string selection gate lines are formed in a subsequent process.

While the first and second grooves 114a and 114b are formed, a remaining pattern can be formed in the recessed region of the device isolation layer 104 at both sides of the exposed preliminary floating gate 108. The remaining pattern includes a lower remaining pattern 110r which is a part of a remaining portion of the blocking insulation layer 110, and an upper remaining pattern 112r which is a part of a remaining portion of the first conductive layer 112.

Figure 8A:
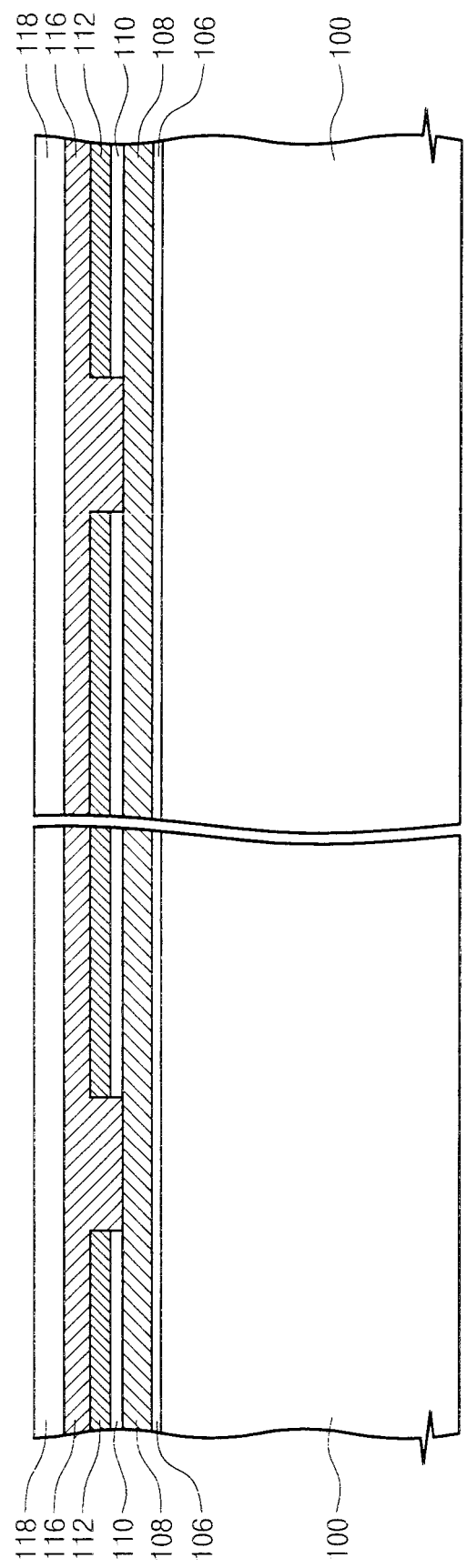
Figure 8B:
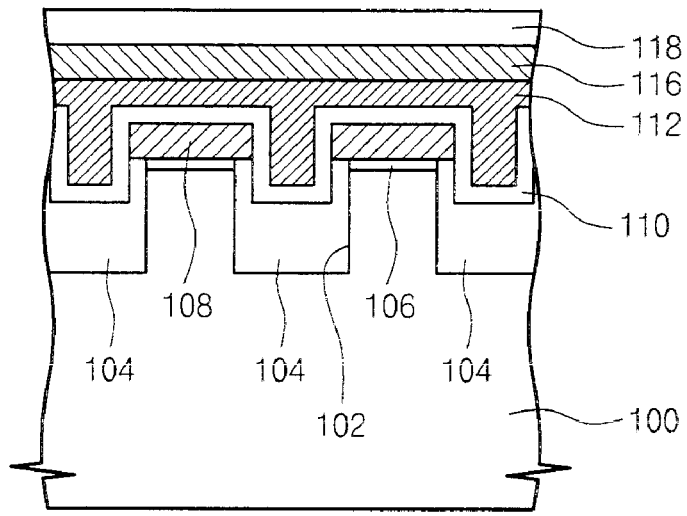
Figure 8C:
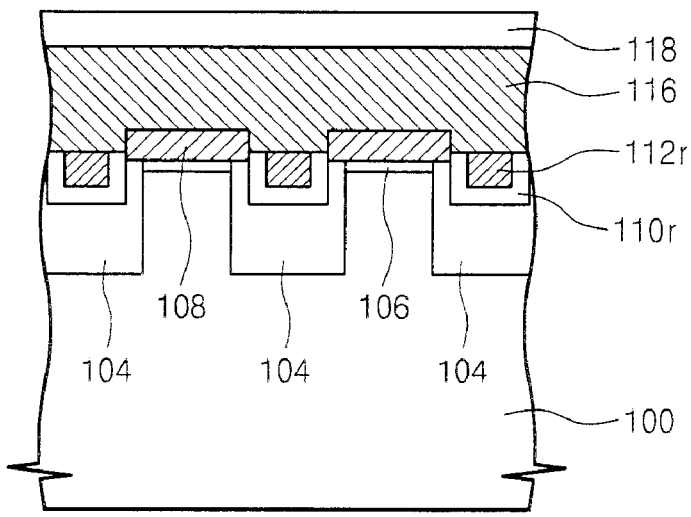

Referring to FIGS. 8A, 8B and 8C, a second conductive layer 116 filling the grooves 114a and 114b is formed on an entire surface of the semiconductor substrate 100, and a capping layer 118 is formed on the second conductive layer 116. The second conductive layer 116 contacts the preliminary floating gate 108 exposed to the grooves 114a and 114b.

The second conductive layer 116 can include at least one selected from the group consisting of a doped polysilicon, a metal (for example, tungsten (W), molybdenum (Mo), etc.) and a metal silicide (for example, tungsten silicide, cobalt silicide, etc.). The capping layer 118 can be formed of an insulation layer having an etch selectivity to the second conductive layer 116, the first conductive layer 112, the blocking insulation layer 110, the preliminary floating gate 108 and the gate insulation layer. For example, the capping layer 118 can be formed of a silicon nitride.

Figure 9A:
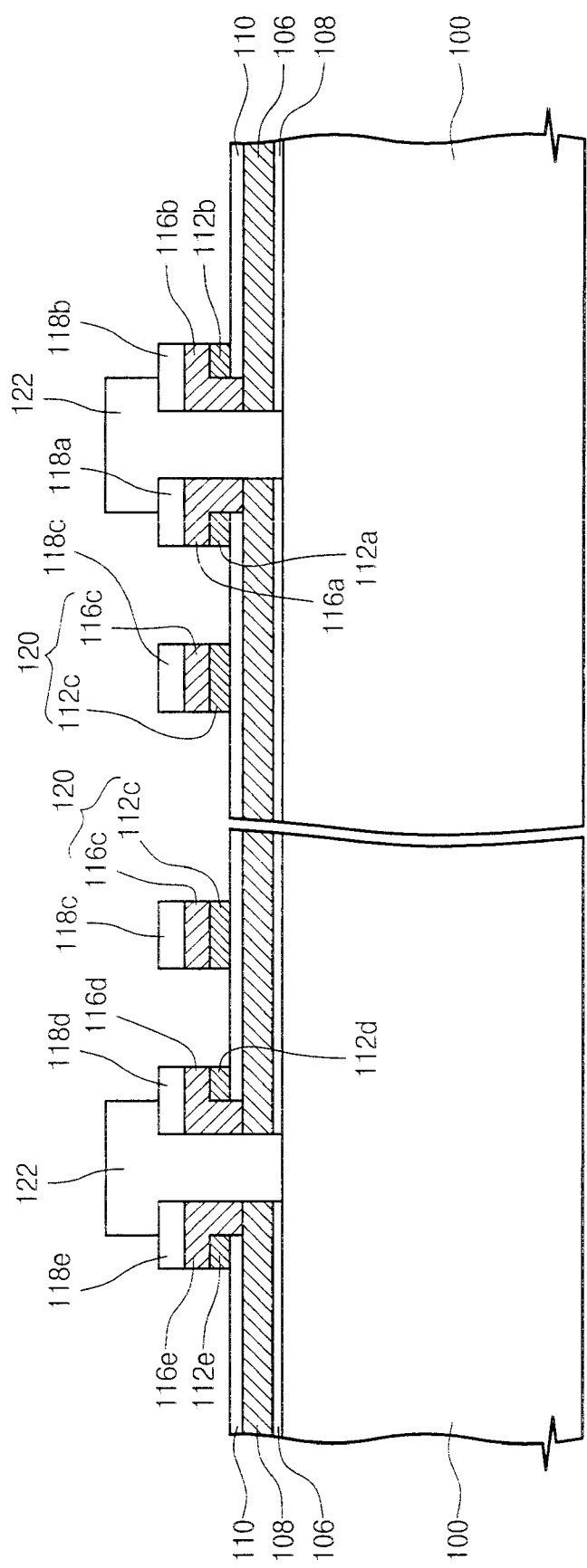
Figure 9B:
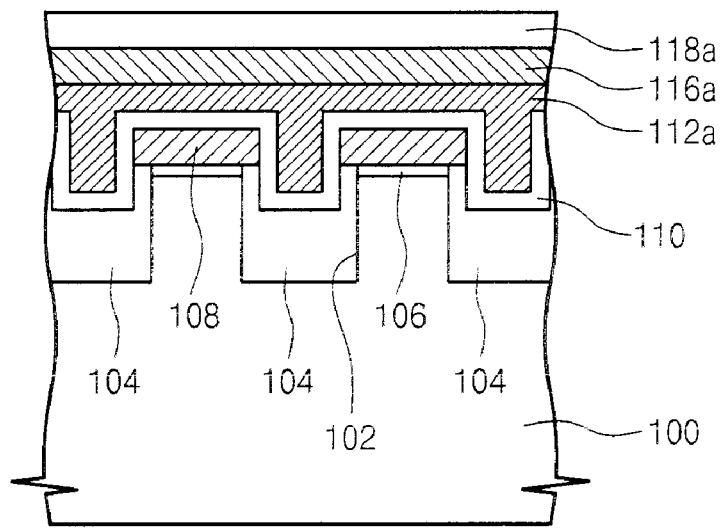
Figure 9C:
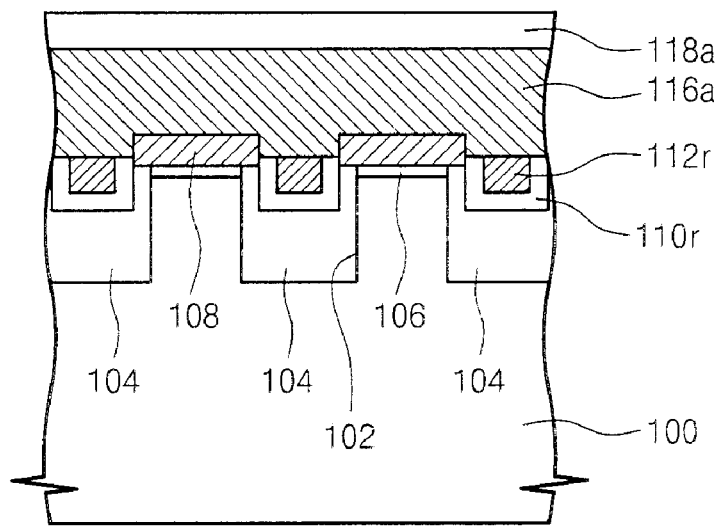

Referring to FIGS. 9A, 9B and 9C, the capping layer 118 is patterned to form a first ground selection capping pattern 118a, a second ground selection capping pattern 118b, cell capping patterns 118c, a first string selection capping pattern 118d and a second string selection capping pattern 118e.

The cell capping patterns 118c are disposed between the first ground selection capping pattern 118a and the first string selection capping pattern 118d. The second ground selection capping pattern 118d is disposed at one side of the first ground selection capping pattern 118a and on the second conductive layer 116 of an opposite side of the cell capping patterns 118c.

The second conductive layer 116, the first conductive layer 112 and the preliminary floating gate 108 are sequentially patterned by using the capping patterns 118a, 118b, 118c, 118d and 118e as an etch stop layer. At this time, a center portion of the preliminary floating gate 108 exposed to the first groove 114a, and a center portion of the preliminary floating gate 108 exposed to the second groove 114b are removed.

By the aforementioned patterning process, a plurality of control gate electrodes 120 are formed on a region between the first and second grooves 114a and 114b. The control gate electrodes 120 include a control lower gate 112c and a control upper gate 116c sequentially stacked. Also, a first ground selection upper gate 116a covering a first sidewall of the first groove 114a and a second ground selection upper gate 116b covering the second sidewall of the second groove 114a are formed. Additionally, a first string selection upper gate 116d covering a first sidewall of the second groove 114b and a second string selection upper gate 116e covering a second sidewall of the second groove 114b are formed.

Further, by the above patterning process, a first pattern 112a is formed between the first ground selection upper gate 116a and the blocking insulation layer 110, and a second pattern 112b is formed between the second ground selection upper gate 116b and the blocking insulation layer 110. The first pattern 112a is formed as an edge of the first conductive layer 112 constituting the first sidewall of the first groove 114a, and the second pattern 112b is formed as an edge of the first conductive layer 112 constituting the second sidewall of the first groove 114a.

Likewise, by the above patterning process, a third pattern 112d is formed between the first string selection upper gate 116d and the blocking insulation layer 110, and a fourth pattern 112e is formed between the second string selection upper gate 116e and the blocking insulation layer 110. The third pattern 112d is formed as an edge of the first conductive layer 112 constituting the first sidewall of the second groove 114b, and the fourth pattern 112e is formed as an edge of the first conductive layer 112 constituting the second sidewall of the second groove 114b.

The first ground selection upper gate 116a extends downwardly along the first sidewall of the first groove 114a to contact a part of the preliminary floating gate remaining below the first groove 114a. The second ground selection upper gate 116b extends downwardly along the second sidewall of the first groove 114a to contact a part of the preliminary floating gate remaining below the first groove 114a. The part of the preliminary floating gate 108 contacting the first ground selection upper gate 116a is spaced apart from the part of the preliminary floating gate 108 contacting the second ground selection upper gate 116a.

Similarly, the first string selection upper gate 116d extends downward along the first sidewall of the second groove 114b to contact a part of the preliminary floating gate 108. The second string selection upper gate 116e extends downwardly along the second sidewall of the second groove 114b to contact a part of the preliminary floating gate 108 remaining below the second groove 114b. The part of the preliminary floating gate 108 contacting the first string selection upper gate 116d is spaced apart from the part of the preliminary floating gate 108 contacting the second string selection upper gate 116e.

Continuously, a photoresist pattern 122 filling the removed portion of the preliminary floating gate 108 is formed below the grooves 114a and 114b.

Figure 10A:
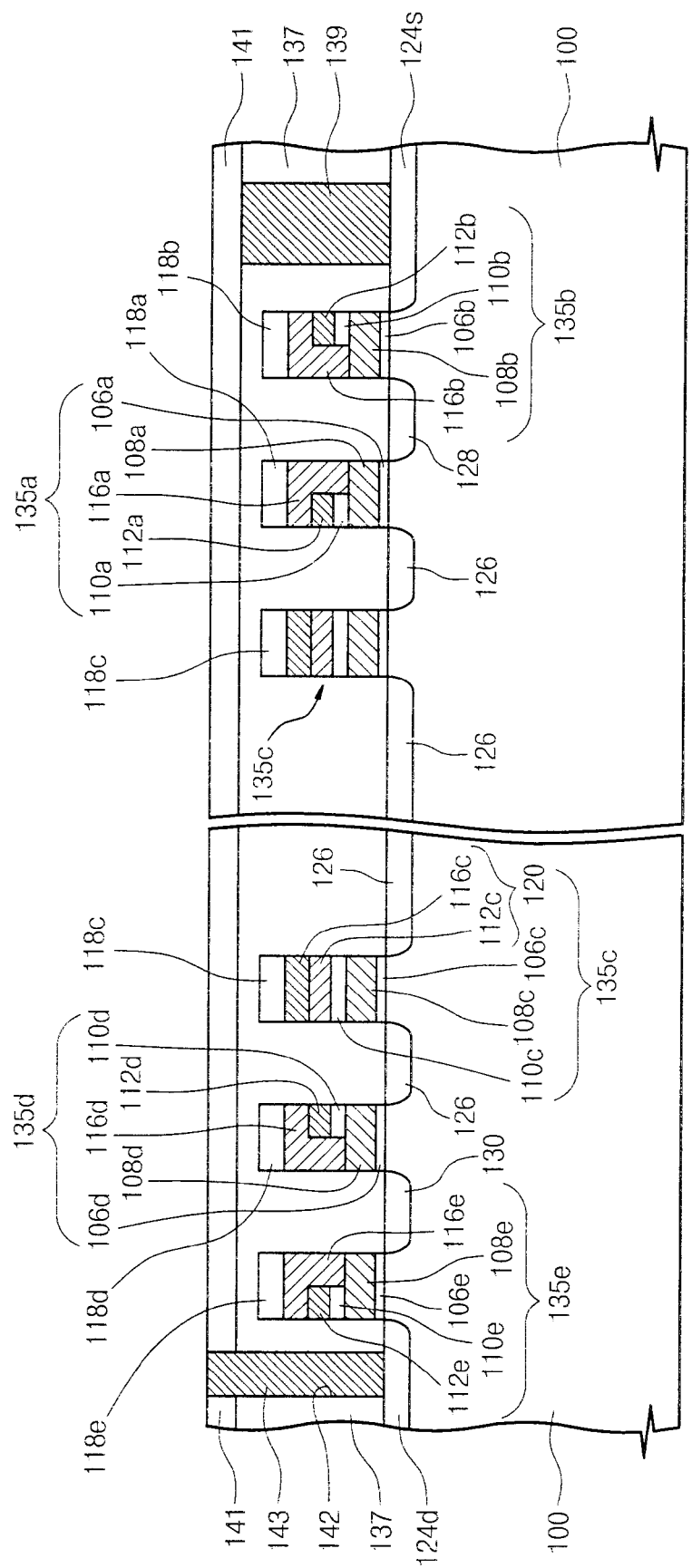
Figure 10B:
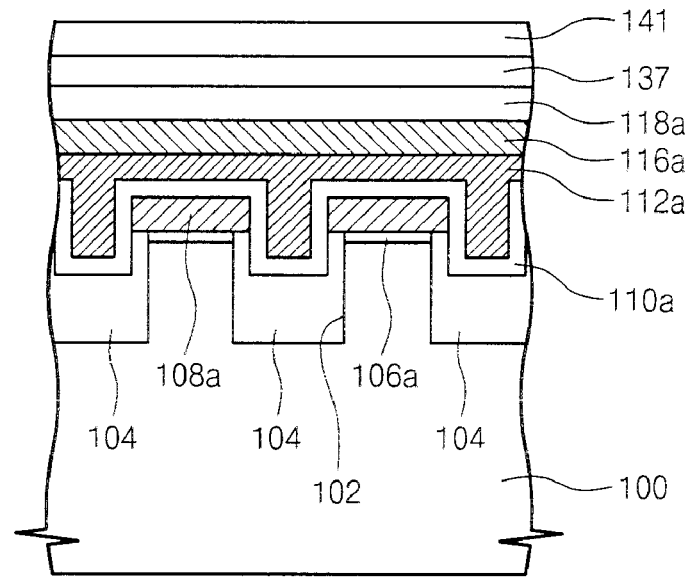
Figure 10C:
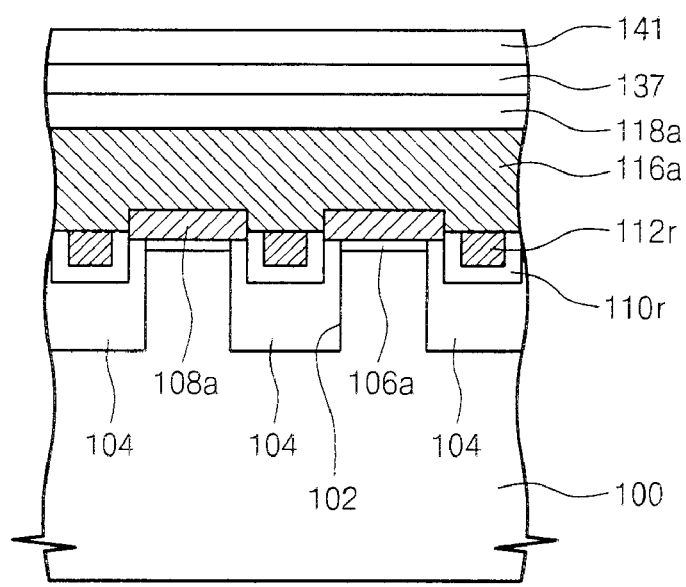

Referring to FIGS. 10A, 10B and 10C, the exposed blocking insulation layer 110, the preliminary floating gate 108 and the gate insulation layer 106 are successively etched using the photoresist pattern 122 and the capping patterns 118a, 118b, 118c, 118d and 1183 to form gate lines 135a, 135b, 135c, 135d and 135e. During the etch process, the photoresist pattern 122 protects the active regions between the first and second ground selection upper gates 116a and 116b and between the first and second string selection upper gates 116d and 116e.

By the above etch process, the tunnel insulation pattern 106c, the floating gate 108c and the blocking insulation pattern 110c sequentially stacked below the control gate 120 are formed. Also, the first insulation pattern 106a and the first ground selection lower gate 108a sequentially stacked below the first ground selection upper gate 106a are formed, and the second insulation pattern 106b and the second ground selection lower gate 108b sequentially stacked below the second ground selection lower gate 116b are formed. Additionally, the third insulation pattern 106d and the first string selection lower gate 108d sequentially stacked below the first string selection upper gate 116d are formed, and the fourth insulation pattern 106e and the second string selection lower gate 108e sequentially stacked below the second string selection upper gate 116e are formed.

In addition, a fifth pattern 110a is formed between the first ground selection lower gate 108a and the first pattern 112a, and a sixth pattern 110b is formed between the second ground selection lower gate 108b and the second pattern 112b. Also, a seventh pattern 110d is formed between the first string selection lower gate 108d and the third pattern 112d, and an eighth pattern 110e is formed between the second string selection lower gate 108e and the fourth pattern 112e.

The fifth pattern 110a is formed as an edge of the blocking insulation layer 110 constituting the first sidewall of the first groove 114a shown in FIG. 7, and the sixth pattern 110b is formed as an edge of the blocking insulation layer 110 constituting the second sidewall of the first groove 114a. Also, the seventh pattern 110d is formed as an edge of the blocking insulation layer 110 constituting the first sidewall of the second groove 114b shown in FIG. 7, and the eighth pattern 110e is formed as an edge of the blocking insulation layer 110 constituting the second sidewall of the second groove 114b.

The first and fifth patterns 112a and 110a correspond to the upper portion 112a and the lower portion 110a of the first ground selection intergate pattern interposed between the first ground selection lower gate 108a and the first ground selection upper gate 116a, respectively. The second and sixth patterns 112b and 110b correspond to the upper portion 112b and the lower portion 110b of the second ground selection intergate pattern interposed between the second ground selection lower gate 108b and the second ground selection upper gate 116b, respectively. The third and seventh patterns 112d and 110d correspond to the upper portion 112d and the lower portion 110d of the first string selection intergate pattern interposed between the first string selection lower gate 108a and the first string selection upper gate 116a, respectively. The fourth and eighth patterns 112e and 110e correspond to the upper portion 112e and the lower portion 110e of the second string selection intergate pattern interposed between the second string selection lower gate 108e and the second string selection upper gate 116b, respectively.

The first ground selection gate line 135a includes the first insulation pattern 106a, the first ground selection upper and lower gates 108a and 116a, and the first ground selection intergate pattern, and the second ground selection gate line 135b includes the second insulation pattern 106b, the second ground selection lower and upper gates 108b and 116b, and the second ground selection intergate pattern. The cell gate line 135c includes the tunnel insulation pattern 106c, the floating gate 108c, the blocking insulation pattern 110c and the control gate electrode sequentially stacked. The first string selection gate line 135d includes the third insulation pattern 106d, the first string selection lower and upper gates 108d and 116d, and the first string selection intergate pattern, and the second string selection gate line 135e includes the fourth insulation pattern 106e, the second string selection lower and upper gates 108e and 116e, and the second string selection intergate pattern.

The first ground selection lower and upper gates 108a and 116a are connected with each other using one of both sidewalls of the aforementioned first groove 114a. Therefore, the line width of the first ground selection gate line 135a can be formed in a minimum line width that can be defined by the photolithography process. Likewise, since the second ground selection gate line 135b and the first and second string selection gate lines 135d and 135e are formed using only one sidewall of each of the grooves 114a and 114b, they can be formed in a minimum line width that can be defined by the photolithography process.

Thereafter, the photoresist pattern 122 is removed from the semiconductor substrate 100.

Subsequently, impurity ions are implanted into the active regions using the gate lines 135a, 135b, 135c, 135d and 135e as a mask to form impurity diffusion layers 124s, 124d, 126, 128 and 130. The impurity diffusion layers 124s, 124d, 126, 128 and 130 perform the same functions as those described with reference to FIG. 4A. In particular, the first impurity diffusion layer 124s disposed at one side of the second ground selection gate line 135b corresponds to the common source region 124s, and the second impurity diffusion layer 124d disposed at one side of the second string selection gate line 135e corresponds to the common drain region 124d.

First interlayer insulating layer 137 is formed on an entire surface of the semiconductor substrate 100 having the impurity diffusion layers 124s, 124d, 126, 128 and 130, and is then patterned to a source groove exposing the common source region 124s and a common source line 139 filing the source groove.

Next, second insulation layer 141 is formed on an entire surface of the semiconductor substrate 100, and the second and first insulation layers 141 and 137 are successively patterned to form a bit line contact hole 142 exposing the common drain region 124d. A bit line contact plug 143 filling the bit line contact hole 142 is formed.

Thereafter, the bit line 145 shown in FIG. 4A and connected with the contact plug 143 is formed on the second insulation layer 143. By doing so, the NAND flash memory device shown in FIGS. 4A, 4B and 4C can be realized.

Next, a method of forming the NAND flash memory device shown in FIG. 5 will be described with reference to the accompanying drawings. This method is similar to the aforementioned method. Therefore, like reference numerals in the drawings denote like elements.

Figure 11:
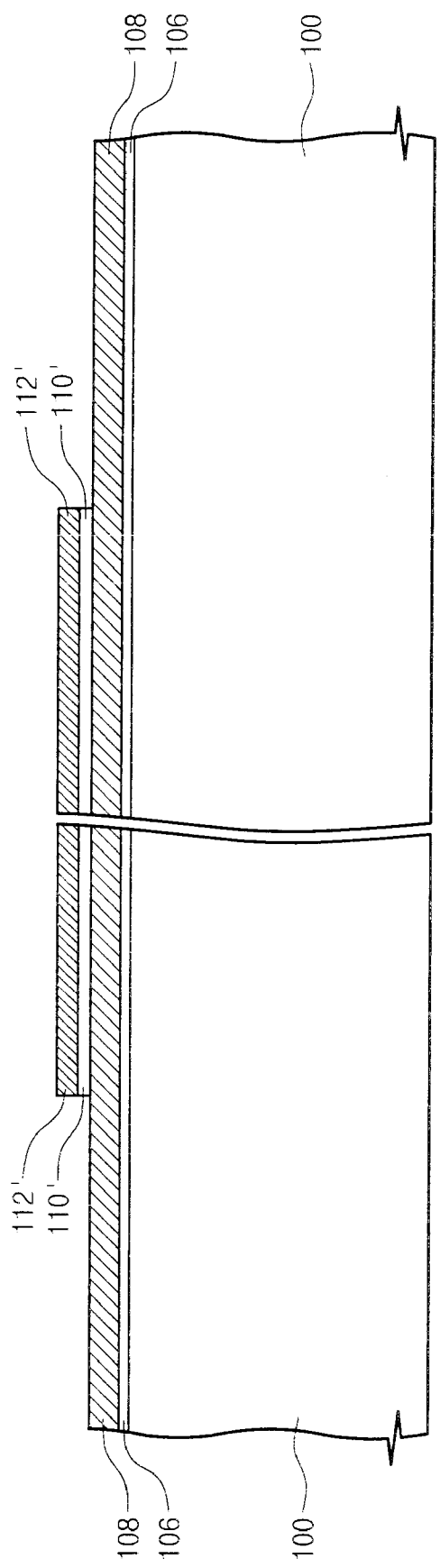
FIGS. 11 through 13 are cross-sectional views illustrating a method of forming the NAND flash memory device shown in FIG. 5.
Figure 12:
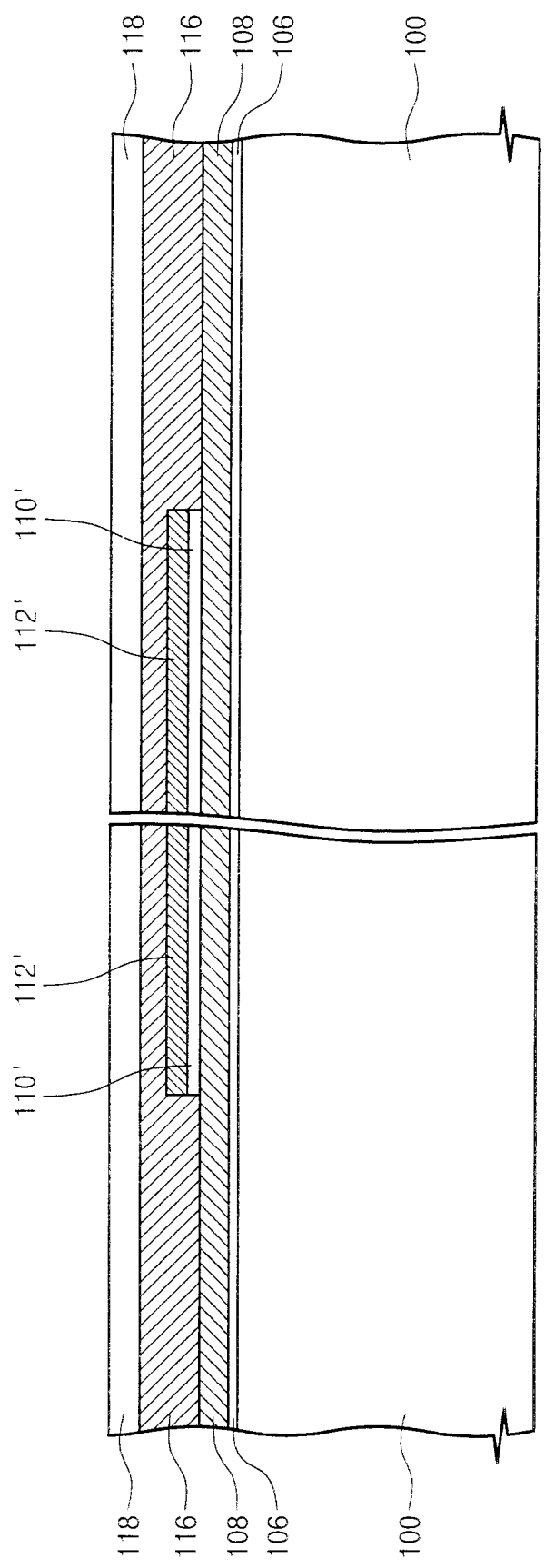
Figure 13:
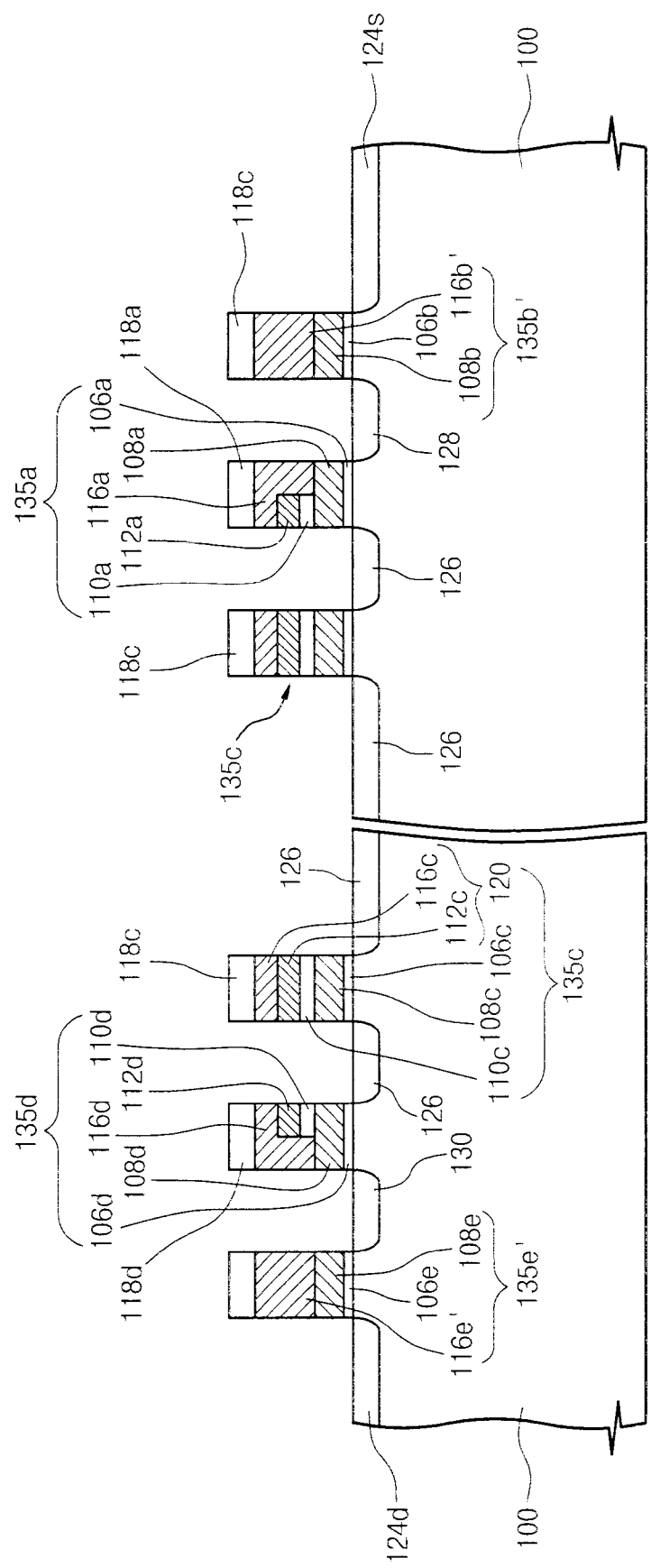

FIGS. 11 through 13 are cross-sectional views illustrating a method of forming the NAND flash memory device shown in FIG. 5.

Referring to FIG. 11, the steps of sequentially forming the blocking insulation layer and the first conductive layer on the semiconductor substrate having the preliminary floating gate 108 can be performed in the same manner as those described in the aforementioned method.

The first conductive layer and the blocking insulation layer are patterned to expose a predetermined region of the preliminary floating gate 108. At this time, the patterned blocking insulation layer and first conductive layer 110' and 112' are formed at regions where cell gate lines are subsequently formed. Also, edges of the patterned blocking insulation layer and first conductive layer 110' and 112' extend to regions where first ground selection gate lines and first string selection gate lines are subsequently formed.

Referring to FIG. 12, second conductive layer 116 and capping layer 118 are sequentially formed on an entire surface of the semiconductor substrate 100. The second conductive layer 116 contacts the exposed preliminary floating gate 108.

Referring to FIG. 13, the capping layer 108 is patterned to form capping patterns 118a, 118b, 118c, 118d and 118e, and the second conductive layer 116, the patterned first conductive layer 112', the patterned blocking insulation layer 110', the preliminary floating gate 108 and the gate insulation layer 106 are successively patterned to form gate lines 135a, 135b', 135c, 135d and 135e'.

At this time, one edge of the patterned first conductive layer 112' and the blocking insulation layer 110' is formed as the first ground selection intergate pattern of the first ground selection gate line 135a, and the other edge of each of the patterned first conductive layer 112' and blocking insulation layer 110' is formed as the first string selection intergate pattern of the first string selection gate line 135d.

The second ground selection gate line 135b' and the second string selection gate line 135e' are formed by patterning only a contact portion between the second conductive layer 116 and the patterned first conductive layer 112'. Therefore, the second ground selection upper gate 116b' of the second ground selection gate line 135b' contacts the entire upper surface of the second ground selection lower gate 108b. Also, the second string selection upper gate 116e' of the second string selection gate line 135e' contacts the entire upper surface of the second string selection lower gate 108e.

The subsequent processes can be performed in the same manner as those described with reference to FIGS. 10A, 10B and 10C.

SECOND EMBODIMENT

Figure 14:
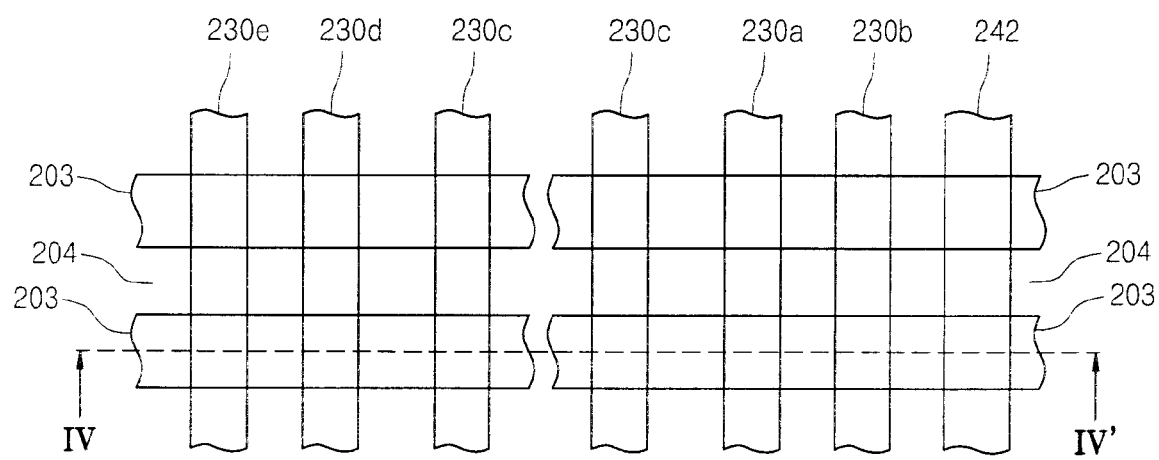
FIG. 14 is a plan view of a NAND flash memory device according to another embodiment of the present invention.
Figure 15:
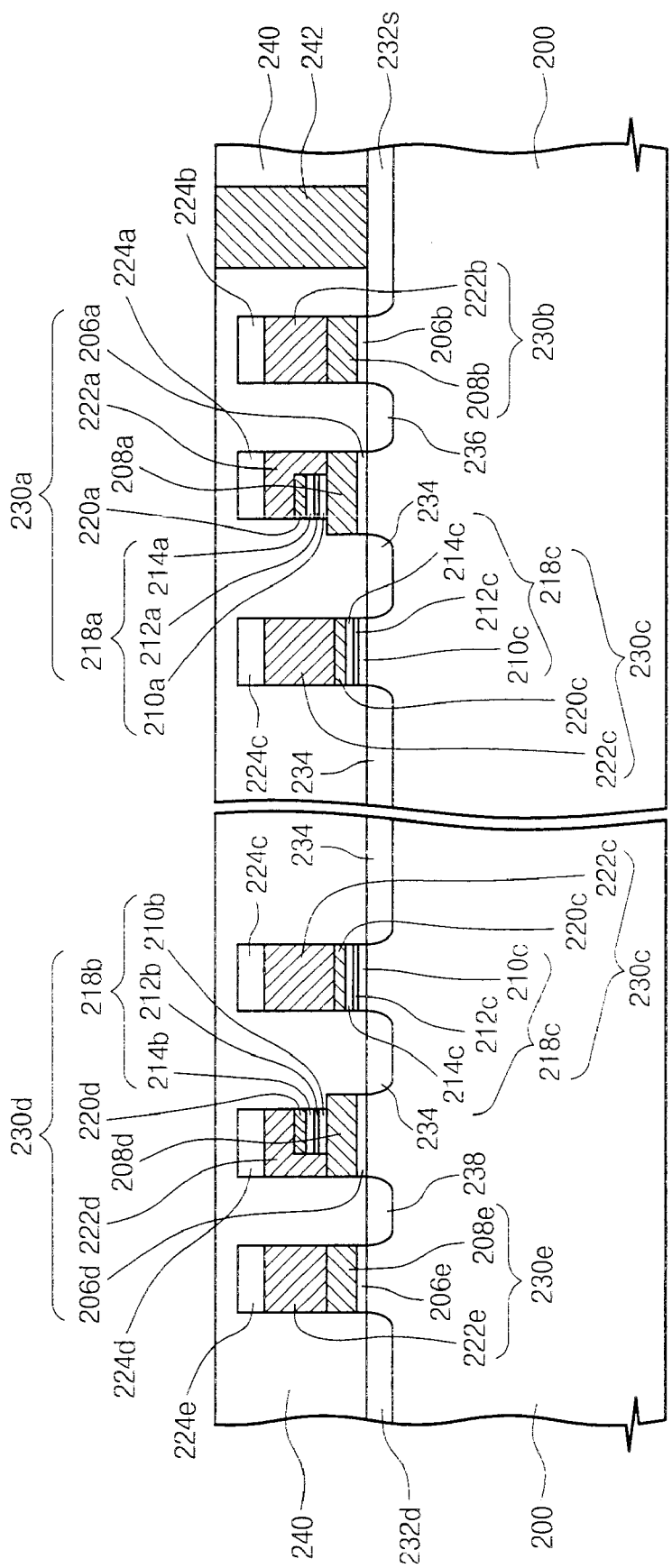
FIG. 15 is a cross-sectional view taken along the line IV-IV' of FIG. 14.

FIG. 14 is a plan view of a NAND flash memory device according to another embodiment of the present invention, and FIG. 15 is a cross-sectional view taken along the line IV-IV' of FIG. 14.

Referring to FIGS. 14 and 15, a device isolation layer 204 defining active regions 203 is disposed at a predetermined region of a semiconductor substrate 200. The active regions 203 are disposed in parallel with one another.

A plurality of cell gate lines 230c cross over the active regions 203 in parallel. The plurality of cell gate lines 230c constitute a cell gate group. First and second ground selection gate lines 230a and 230b are sequentially disposed at one side of the cell gate group. The first and second ground selection gate lines 230a and 230b cross the active regions 203 in parallel and are spaced apart from each other.

A first string selection gate line 230d is disposed at the other side of the cell gate group and crosses over the active regions 203 of an opposite side of the first ground selection gate line 230a. A second string selection gate line 230e is disposed at one side of the first string selection gate line 230d and crosses over the active regions 203 disposed at an opposite side of the first string selection gate line 230d.

The cell gate line 230c includes a multi-layer charge storage pattern 218c and a control gate electrode sequentially stacked. The multi-layer charge storage pattern 218c includes a tunnel insulation pattern 210c, a charge storage pattern 212c, and a blocking insulation pattern 214c sequentially stacked. The control gate electrode includes a control lower gate 220c and a control upper gate 222c sequentially stacked.

The tunnel insulation pattern 210c can be made of a thermal oxide. The charge storage pattern 212c can be made of a trap insulation layer (for example, silicon nitride or the like), a silicon dot layer, a metal dot layer, a silicon germanium dot layer or the like. The blocking insulation pattern 214c can be made of an insulator (for example, a metal oxide insulator, such as hafnium oxide, aluminum oxide or the like) having a higher dielectric constant than the tunnel insulation pattern 210c. The control lower gate 220c can be made of a conductor capable of protecting the multi-layer charge storage pattern 218c from etch damage, for example, a doped polysilicon, a conductive metal nitride (for example, titanium nitride, tantalum nitride, etc.). The control upper gate 222c can include at least one selected from the group consisting of a metal (for example, tungsten (W), molybdenum (Mo), etc.), a conductive metal nitride (for example, titanium nitride, tantalum nitride, etc.) and a metal silicide (for example, tungsten silicide, cobalt silicide, etc.).

The first ground selection gate line 230a includes a first insulation pattern 206a, a first ground selection lower gate 208a and a first ground selection upper gate 222a. Also, the first ground selection gate line 230a further includes a first ground intergate pattern interposed between the first ground selection lower and upper gates 208a and 222a. At this time, the first ground selection lower and upper gates 208a and 222a are electrically connected with each other. The first intergate pattern can be comprised of a lower portion 218a and an upper portion 220a.

The first intergate pattern has a width that is narrower than that of each of the first ground selection lower and upper gates 208a and 222a. Therefore, the intergate pattern contacts a part of an upper surface of the first ground selection lower gate 208a. The first ground selection upper gate 222a also contact a part of the upper surface of the first ground selection lower gate 208a.

The first ground selection lower gate 208a, the first selection intergate pattern and the first ground selection upper gate 222a have first sidewalls adjacent to the cell gate line 230c and second sidewalls disposed at an opposite side of the first sidewalls. The first sidewalls of the first ground selection upper gate 222a and the first intergate pattern can be aligned with each other. The first ground selection upper gate 222a contacts the second sidewall of the first intergate pattern and an upper surface of the first ground selection lower gate 208a disposed at one side of the second sidewall of the first intergate pattern. The second sidewall of the first ground selection upper gate 222a is aligned with the second sidewall of the first ground selection lower gate 208a. The width of the first ground selection lower gate 208a can be wider than the width of the first ground selection upper gate 222a. Therefore, the first sidewall of the first ground selection lower gate 208a protrudes laterally.

It is preferable that the first ground selection upper gate 222a be made of the same material as the control upper gate 222c. The upper portion of the first intergate pattern can be made of the same material as the control lower gate 220c, and the lower portion 218a of the intergate pattern can be made of the same material as the multi-layer charge storage pattern 218c. First, second and third layers 210a, 212a and 214a of the lower portion 218a of the first intergate pattern can be made of the same material as the tunnel insulation pattern 210c, the charge storage pattern 212c and the blocking insulation pattern 214c. The first insulation pattern 206a can be made of a silicon oxide. The first ground selection lower gate 208a is made of a conductor. For example, the first ground selection lower gate 208a can include a doped polysilicon or a conductive metal nitride. The first insulation pattern 206a can be made of a silicon oxide.

The second ground selection gate line 230b includes a second insulation pattern 206b, a second ground selection lower gate 208b and a second ground selection upper gate 222b sequentially stacked. At this time, the second ground selection upper gate 222b contacts an entire upper surface of the second ground selection lower gate 208b. The second insulation pattern 206b can be made of the same material as the first insulation pattern 206a. The second ground selection lower and upper gates 208b and 222b can be made of the same material as the first ground selection lower and upper gates 208a and 222a.

It is preferable that the first string selection gate line 230d be symmetric to the first ground selection gate line 230a. The first string selection gate line 230d includes a third insulation pattern 206d, a first string selection lower gate 208d and a first string selection upper gate 222d. Also, the first string selection gate line 230d further includes a second intergate pattern interposed between the first string selection lower and upper gates 208d and 222d. The second intergate pattern is comprised of a lower portion 218b and an upper portion 220b. The lower portion 218b of the second intergate pattern includes fourth, fifth and sixth layers 210b, 212b and 214b sequentially stacked.

The width of the second intergate pattern is narrower than widths of the first string selection lower and upper gates 208d and 222d. By doing so, the first string selection upper gate 222d simultaneously contacts the first string selection lower gate 208d and the second intergate pattern.

The first string selection lower gate 208d, the second intergate pattern and the first string selection upper gate 222d have first sidewalls adjacent to the cell gate group, and second sidewalls disposed at an opposite side of the first sidewalls. The first sidewall of the first string selection upper gate 222d is aligned with the first sidewall of the second intergate pattern. The second sidewall of the second intergate pattern is covered by the first string selection upper gate 222d. The first string selection upper gate 222d contacts a part of an upper surface of the first string selection lower gate 208d disposed at one side of the second sidewall of the second intergate pattern. The second sidewall of the first string selection upper gate 222d is aligned with the second sidewall of the first string selection lower gate 208d. The width of the first string selection lower gate 208d can be wider than that of the first string selection upper gate 222d. Therefore, the first sidewall of the first string selection lower gate 208d can be protruded laterally.

The first string selection lower and upper gates 208d and 222d can be made of the same material as the first ground selection lower and upper gates 208a and 222a. The second intergate pattern can be made of the same material as the first intergate pattern. The lower portion 218b and upper portion 220b of the second intergate pattern can be made of the same material as the lower portion 218b and upper portion 220b of the first intergate pattern. The fourth, fifth and sixth layers 210b, 212b and 214b of the lower portion 218b of the second intergate pattern can be made of the same material as the first, second and third layers 210a, 212a and 214a of the lower portion 218a of the first intergate pattern. The third insulation pattern 206d can be made of the same material as the first insulation pattern.

It is preferable that the second string selection gate line 230e be symmetric to the second ground selection gate line 230b. The second string selection gate line 230e includes a fourth insulation pattern 206e, a second string selection lower gate 208e and a second string selection upper gate 222e. The second string selection upper gate 222e contacts an entire upper surface of the second string selection lower gate 208e. The fourth insulation pattern 206e can be made of the same material as the second insulation pattern 206b. The second string selection lower and upper gates 2083 and 222e can be made of the same material as the second ground selection lower and upper gates 208b and 222b.

First and second ground selection capping patterns 224a and 224b are respectively disposed on the first and second ground selection gate lines 230a and 230b, and first and second string selection capping patterns 224d and 224e are respectively disposed on the first and second string selection gate lines 230d and 230e. A cell capping pattern 224c is disposed on the cell gate line 230c. The capping patterns 224a, 224b, 225c, 224d and 224e can be made of an insulator having an etch selectivity with respect to the gate lines 230a, 230b, 230c, 230d and 230e. For example, the capping patterns 224a, 224b, 225c, 224d and 224e can be made of a silicon nitride.

Impurity diffusion layers 232s, 232d, 232c, 230d and 230e are formed in the active region 203 at both sides of the gate lines 230a, 230b, 230c, 230d and 230e.

The first impurity diffusion layer 232s is formed in the active region which is disposed at one side of the second ground selection gate line 230b and is an opposite side of the first ground selection gate line 230a, and it corresponds to a common source region 232s. The second impurity diffusion layer 232d is formed in the active region which is disposed at one side of the second string selection gate line 230e and is an opposite side of the first string selection gate line 230d, and it corresponds to a common drain region 232d. The third impurity diffusion layer 234 is formed in the active region 203 at both sides of the cell gate line 230c, and it corresponds to a source/drain region of the cell transistor. At this time, the third impurity diffusion layer 234 between the first ground selection gate line 230a and the cell gate line 230c adjacent thereto corresponds to the source of the cell transistor and at the same time to a drain of the first ground selection transistor. Likewise, the third impurity diffusion layer 234 between the first string selection gate line 230d and the cell gate line 230c adjacent thereto corresponds to the drain of the cell transistor and at the same time to a source of the first ground selection transistor. The fourth impurity diffusion layer 236 between the first and second ground selection gate lines 230a and 230b corresponds to the source of the first ground selection transistor and at the same time to a drain of the second ground selection transistor. The fifth impurity diffusion layer 130 between the first and second string selection gate lines 230d and 230e corresponds to the drain of the first string selection transistor and at the same time to a source of the second string selection transistor.

An interlayer insulating layer 240 covers the entire surface of the semiconductor substrate 200. The interlayer insulating layer 240 can be made of a silicon oxide. A common source line 242 penetrates the interlayer insulating layer 240 to be connected with the common source region 232s. The common source region 232s is connected to common source regions 232s respectively formed in the plurality of active regions 203.

Although not shown in the drawings, a bit line can be disposed on another interlayer insulating layer covering the interlayer insulating layer 240 like in the first embodiment. The bit line penetrates the interlayer insulating layers to be connected to the common drain region 232d via a contact plug.

A programming method of the aforementioned NAND flash memory device can be performed in the same manner as that of the first embodiment. At this time, the channel voltage of a non-selected cell transistor sharing the cell gate line 230c with a selected cell transistor is highly boosted. The boosted channel voltage of the non-selected cell transistor is applied to the drain (i.e., the third impurity diffusion layer 234 at one side of the first ground selection gate line 230a) of the first ground selection transistor via another neighboring cell transistor. At this time, as a constant voltage is applied to the first ground selection gate line 230a, a voltage obtained by subtracting a threshold voltage of the first ground selection transistor from the constant voltage is applied to the source (i.e., the fourth impurity diffusion layer 236) of the first ground selection transistor. As a result, punch-through characteristic between the drain (i.e., the fourth impurity diffusion layer 236) and the source (i.e., the common source region 232s) are enhanced. Also, DIBL phenomenon of the second ground selection transistor including the second ground selection gate line 230b can be minimized to minimize the leakage current of the NAND flash memory device.

Also, the first string selection transistor including the first string selection gate line 230d serves as a buffer for the boosted channel voltage. Therefore, the leakage current through the second string selection transistor including the second string selection gate line 230e is minimized.

In addition, the first intergate pattern is disposed leaning toward one edge of the upper surface of the first ground selection lower gate 208a, and the second sidewalls of the first ground selection lower and upper gates 208a and 222a are aligned with each other. By doing so, the first ground selection gate line 230a has a minimum line width in design rule, and at the same time the first ground selection lower and upper gates 208a and 222a can be connected with each other. Further, the second ground selection gate line 230b does not have any other pattern between the second ground selection lower and upper gates 208b and 222b. By doing so, the second ground selection gate line 230b has a minimum line width within the design rule, and at the same time the second ground selection lower and upper gates can be connected with each other. As a result, a highly integrated NAND flash memory device can be realized.

Since the first and second string selection gate lines 230d and 230e are symmetric in structure to the first and second ground selection gate lines 230a and 230b, respectively, the first and second string selection gate lines 230d and 230e also have a minimum line width within the design rule, and at the same time, their lower gates 208d and 208e can contact the upper gates 222d and 222e, respectively.

Meanwhile, the first ground selection gate line 230a may have a different structure, which will be described with reference to FIGS. 16, 17A and 17B. A NAND flash memory device of the present modified example is similar to the aforementioned NAND flash memory device. Accordingly, like reference numerals in the drawings denote like elements.

Figure 16:
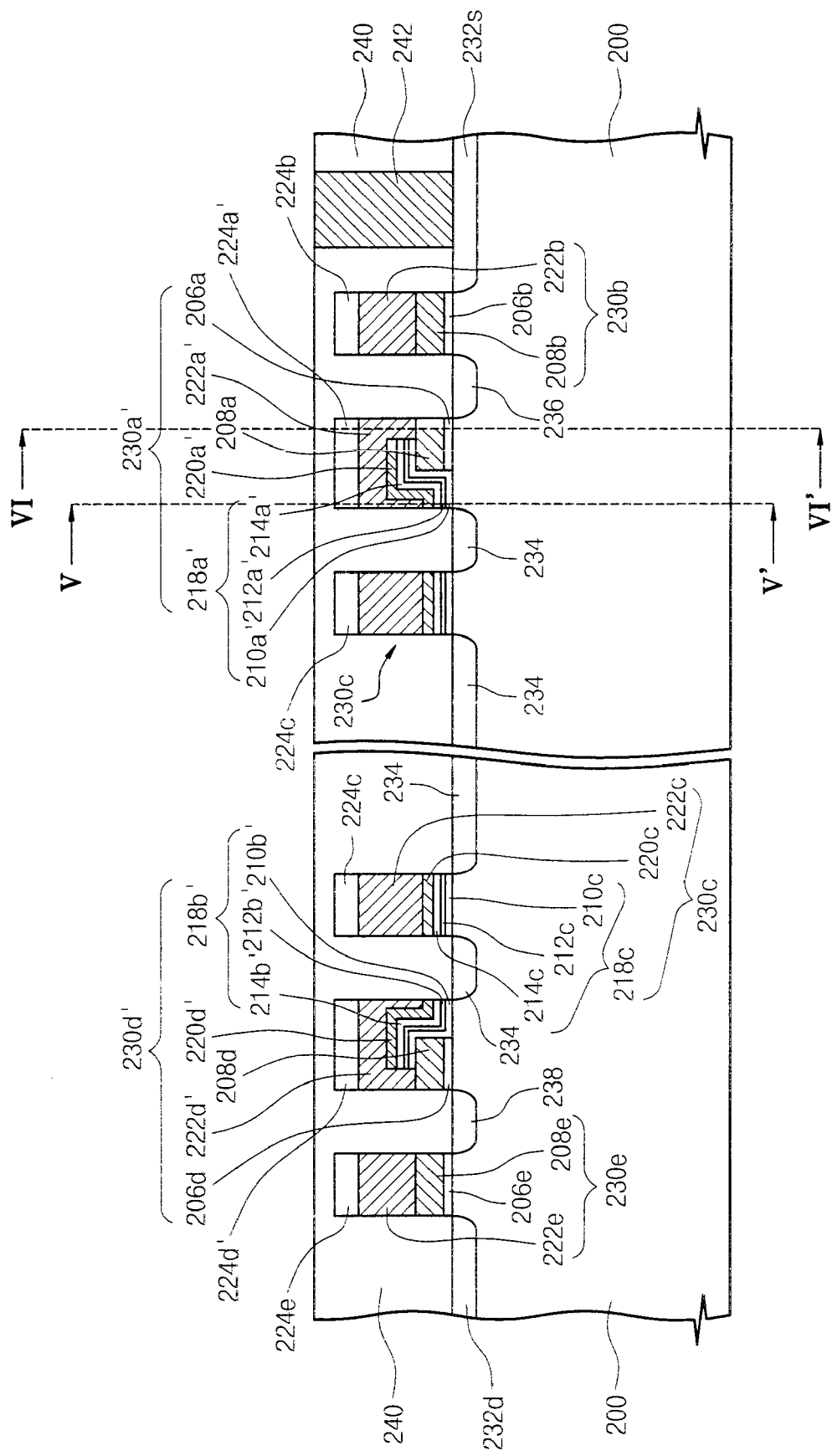
FIG. 16 is a cross-sectional view showing a modification of the NAND type flash memory device according to another embodiment of the present invention.
Figure 17A:
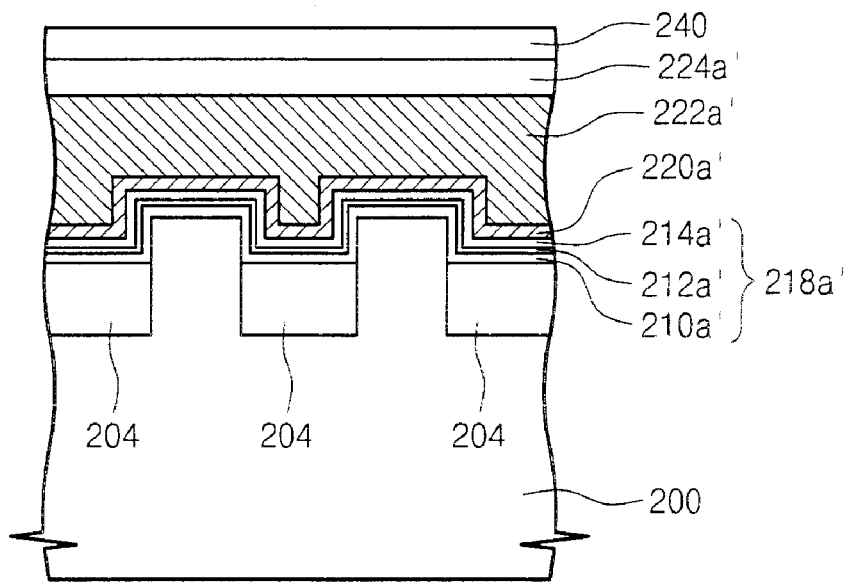
FIGS. 17A and 17B are cross-sectional views taken along the lines V-V' and VI-VI' of FIG. 16, respectively.
Figure 17B:
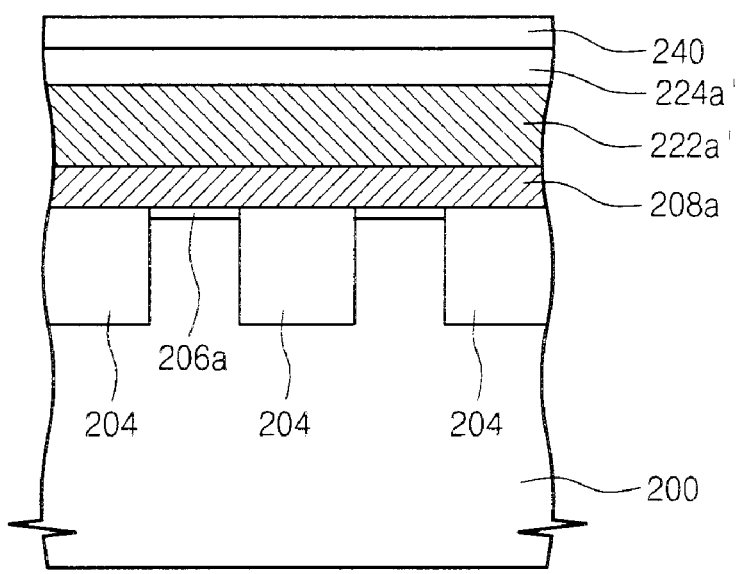

FIG. 16 is a cross-sectional view showing a modification of the NAND type flash memory device according to another embodiment of the present invention, and FIGS. 17A and 17B are cross-sectional views taken along the lines V-V' and VI-VI' of FIG. 16, respectively.

Referring to FIGS. 16, 17A and 17B, a first ground selection gate line 230a' includes a first insulation pattern 206a, a first ground selection lower gate 208a and a first ground selection upper gate 222a' sequentially stacked. Also, the first ground selection gate line 230a' includes a first intergate pattern interposed between the first ground selection lower and upper gates 208a and 222a'. The first intergate pattern is comprised of a lower portion 218a' and an upper portion 220a'.

The first ground selection lower gate 208a, the first intergate pattern and the first ground selection upper gate 222a' have first sidewalls adjacent to the cell gate line 230c and second sidewalls disposed at an opposite side of the first sidewalls.

The first ground selection upper gate 222a' covers the second sidewall of the first intergate pattern, and partially contacts an upper surface of the first ground selection lower gate 208a disposed at one side of the second sidewall of the first intergate pattern.

The first ground selection upper gate 222a' extends laterally toward the cell gate line 230c to cover the first sidewall of the first ground selection lower gate 208a. Also, the first ground selection upper gate 222a' partially covers the active region 203 disposed at one side of the first sidewall of the first ground selection lower gate 208a. At this time, the first intergate pattern extends laterally to be interposed between the first ground selection upper gate 222a' and the first ground lower gate 208a, and between the first ground selection upper gate 222a' and the active region 203. The first sidewall of the first ground selection upper gate 222a' is aligned with the first sidewall of the first intergate pattern.

The first ground selection upper gate 222a' can be made of the same material as a control upper gate 222c. The lower portion 218a' and upper portion 220a' of the first intergate pattern can be made of the same material as a multi-layer charge storage pattern 218c and a control lower gate 220c. The lower portion 218a' of the first intergate pattern includes first, second and third layers 210a', 212a' and 214a' sequentially stacked. The first, second and third layers 210a', 212a' and 214a' can be made of the same material as a tunnel insulation pattern 210c, a charge storage pattern 212c and a blocking insulation pattern 214c.

An upper surface of a device isolation layer 204 can include a first portion, which is lower than an upper surface of the semiconductor substrate 200, and a second portion, which is equal in height or higher than the upper surface of the semiconductor substrate 200. Due to the existence of the first portion, a recessed portion is formed. A part of the first intergate pattern contacting the active region 203 extends to fill the recessed portion. At this time, the first ground selection lower gate 208a extends over the second portion of the device isolation layer 204.

It is preferable that the first string selection gate line 230d be symmetric to the first ground selection gate line 230a'. The first string selection gate line 230d' includes a third insulation pattern 206d, and first selection lower and upper gates 208d' and 222d', and the first string selection lower and upper gates 230d' includes a second intergate pattern interposed between the first string selection lower and upper gates 208d and 222d'. The second intergate pattern is comprised of a lower portion 218b' and an upper portion 220b'. The lower portion 218b' of the second intergate pattern includes fourth, fifth and sixth layers 210b', 212b' and 214b' sequentially stacked.

The first string selection lower and upper gates 208d' and 222d' are symmetric to the first ground selection lower and upper gates 208a' and 222a', and the second intergate pattern is symmetric to the first intergate pattern.

The first string selection lower and upper gates 208d and 222d' are made of the same material as the first ground selection lower and upper gates 208a and 222a', and the upper portion 220b' of the second intergate pattern is made of the same material as the upper portion 220a' of the first intergate pattern. The fourth, fifth and sixth layers 210b', 212b' and 214b' are made of the same material as the first, second and third layers 210a', 212a' and 214a', respectively.

A first ground selection capping pattern 224a' is disposed on the first ground selection gate line 230a', and a second ground selection capping pattern 224d' is disposed on the first string selection gate line 230d'. The first and second ground selection capping patterns 224a' and 224d' are made of the same material as a cell capping pattern 224c.

In the NAND flash memory device having the aforementioned structure, a channel region below the first ground selection gate line 230a' is divided into a first region below the first intergate pattern and a second region below the first insulation pattern 206a. At this time, the first intergate pattern is thicker than the first insulation pattern 206a. Accordingly, a threshold voltage of the first region is higher than that of the second region. As a result, the first ground selection transistor having the first ground selection gate line 230a' has a high threshold voltage at a part of the channel region thereof. By doing so, the first ground selection transistor further reduces the boosted channel voltage of a non-selected cell transistor, thereby minimizing the leakage current between the drain and source regions (i.e., common source region 232s) of the second ground selection transistor.

Like in the first embodiment, the NAND flash memory device according to the present embodiment can include the first and second ground selection gate lines 230a and 230, and one string selection gate line. Alternatively, the NAND flash memory device may include the first and second string selection gate lines 230d and 230e and one ground selection gate line.

Figure 18:
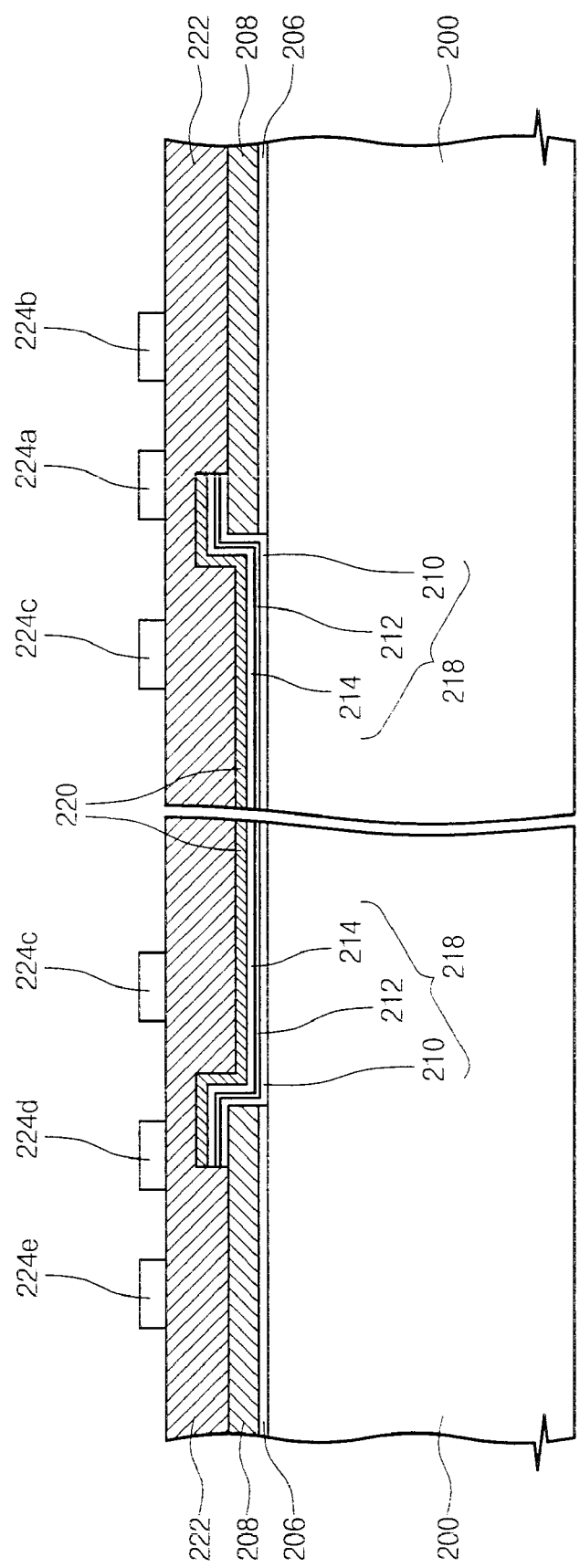
FIGS. 18 through 20 are cross-sectional views taken along the line IV-IV' of FIG. 14 to explain a method of forming a NAND flash memory device according to an embodiment of the present invention.
Figure 19:
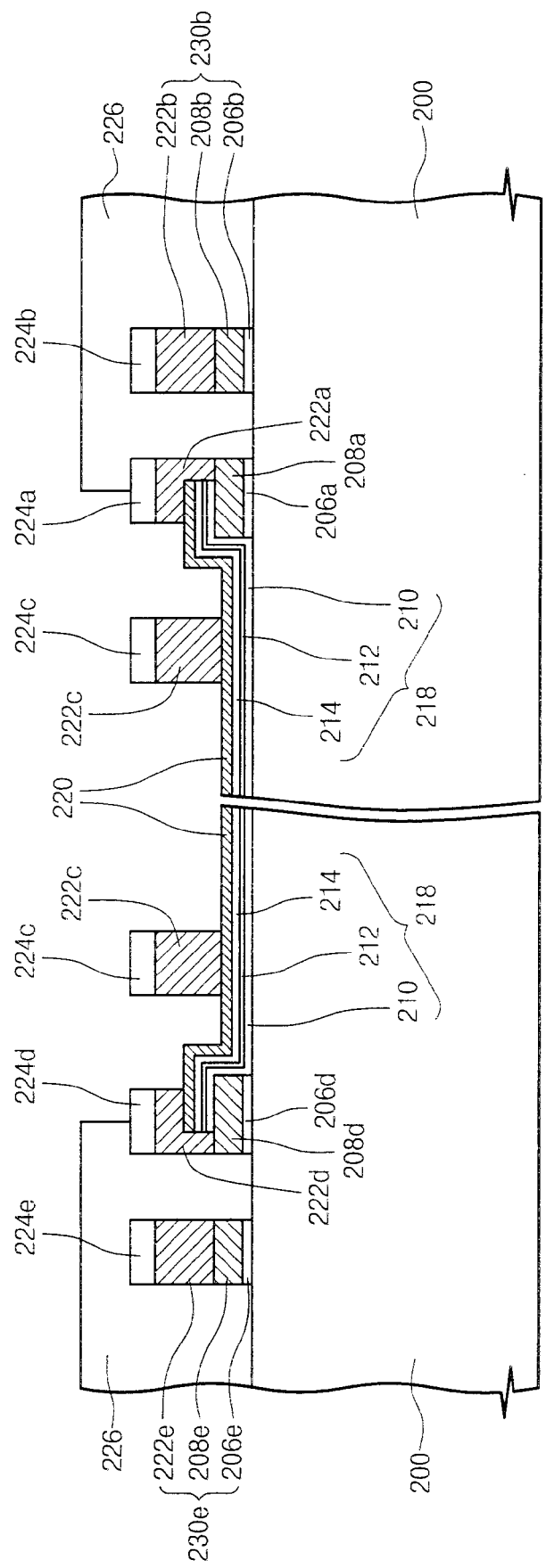
Figure 20:
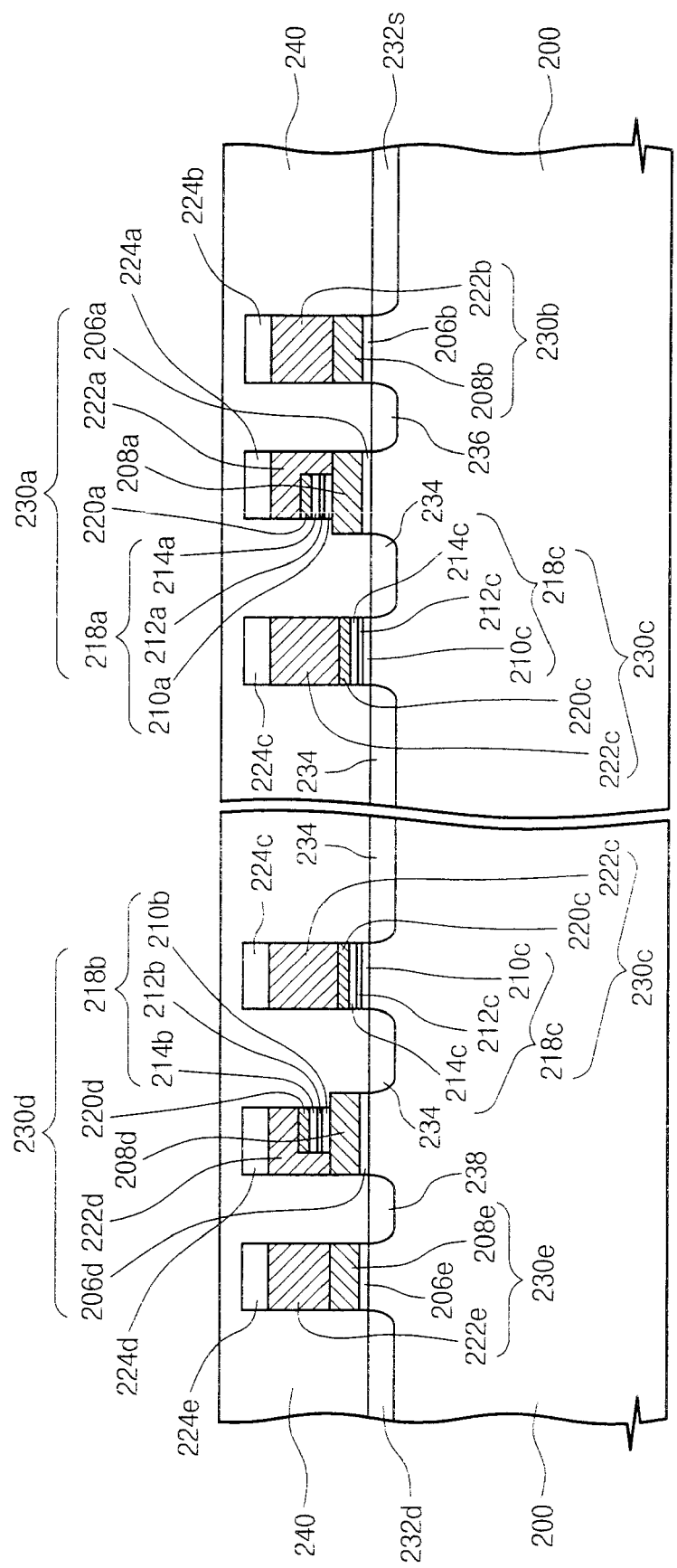

FIGS. 18 through 20 are cross-sectional views taken along the line IV-IV' of FIG. 14 to explain a method of forming a NAND flash memory device according to an embodiment of the present invention.

Referring to FIG. 18, a device isolation layer 204 is formed in a semiconductor substrate to define an active region 203.

An insulation layer 206 and a first conductive layer 208 are sequentially formed on the semiconductor substrate 200 having the active region 203. The insulation layer 206 can be formed of a silicon oxide, in particular, a thermal oxide. The first conductive layer 206 can be formed of a doped polysilicon layer or a conductive metal nitride (for example, titanium nitride, tantalum nitride or the like).

The first conductive layer 208 and the insulation layer 206 are successively patterned to expose a predetermined portion of the active region 203. The exposed active region 203 includes a region where cell gate lines are subsequently formed.

A multi-layer charge storage layer 218 and a second conductive layer 220 are sequentially formed on an entire surface of the semiconductor substrate 200 having the exposed active region 203. The multi-layer charge storage layer 218 contacts the exposed active region. The multi-layer charge storage layer 218 includes a tunnel insulation layer 210, a charge storage layer 212 and a blocking insulation layer 214 sequentially stacked. The tunnel insulation layer 210 can be formed of a silicon oxide, in particular, a thermal oxide. The charge storage layer 212 can be formed of at least one selected from the group consisting of a silicon dot layer, a metal dot layer and a silicon germanium dot layer. The blocking insulation layer 214 can be formed of an insulation layer having a higher dielectric constant than the tunnel insulation layer 210. For example, the blocking insulation layer 214 can be formed of a metal oxide insulator, such as a hafnium oxide, aluminum oxide or the like. Alternatively, the blocking insulation layer 214 can be formed of a silicon oxide. In this case, the blocking insulation layer 214 is formed thicker than the tunnel insulation layer 210.

The second conductive layer 220 is formed of a conductive layer capable of protecting the multi-layer charge storage layer 218 from an etch damage, for example, a doped polysilicon, a conductive metal nitride (for example, titanium nitride, tantalum nitride, etc.).

The second conductive layer 220 and the multi-layer charge storage layer 218 are successively patterned to expose the patterned first conductive layer 208. At this time, edges of the patterned second conductive layer 220 and the multi-layer charge storage layer 218 overlap an edge of the patterned first conductive layer 208.

A third conductive layer 222 and a capping layer are sequentially formed on an entire surface of the semiconductor substrate 200. Preferably, the third conductive layer 222 includes at least one selected from the group consisting of a doped polysilicon layer, a metal layer (for example, tungsten, molybdenum or the like), a conductive metal nitride (for example, titanium nitride, tantalum nitride or the like), and a metal silicide (for example, tungsten silicide, cobalt silicide or the like).

The capping layer is patterned to form capping patterns 224a, 224b, 224c, 224d and 224e spaced apart in parallel on the third conductive layer 222. The plurality of cell capping patterns 224c are arranged in parallel in a contact portion between the multi-layer charge storage layer 218 and the active region, and the first and second ground selection capping patterns 224a and 224b are sequentially disposed at one side of the cell capping patterns 224. The first ground selection capping pattern 224a simultaneously covers some of a portion where the patterned first conductive layer overlaps the patterned second conductive layer, and some of a portion where the third conductive layer 222 contacts the patterned first conductive layer 208. The second ground selection capping pattern 224b covers some of a contact portion between the third conductive layer 222 and the patterned first conductive layer 208. The first and second string selection capping patterns 224a and 224b are sequentially disposed at the other side of the cell capping patterns 224.

The first and second string selection capping patterns 224d and 224e are arranged symmetric to the first and second string selection capping patterns 224a and 224b.

Referring to FIG. 19, at least the third conductive layer 222, the patterned first conductive layer 208 and the insulation layer 206 are successively etched using the capping patterns 224a, 224b, 224c, 224d and 224e as a mask. At this time, the patterned second conductive layer 220 can be used as an etch stop layer. In this case, the second conductive layer 220 is formed of a conductive material having an etch selectivity with respect to the first and third conductive layers 208 and 222. Alternatively, the multi-layer charge storage layer 218 can be used as an etch stop layer. In the present embodiment, an example where the second conductive layer 220 is used as an etch stop layer will be described.

By the etch process, first ground selection lower and upper gates 208a and 222a sequentially stacked are formed below the first ground selection capping pattern 224a. At this time, the first ground selection upper gate 222a extends downwardly along sidewalls of edges of the patterned second conductive layer 220 and the multi-layer charge storage layer 218 to contact the first ground selection lower gate 208a. The edges of the patterned second conductive layer 220 and the multi-layer charge storage layer 218 are interposed between the first ground selection lower and upper gates 208a and 222a.

Likewise, by the etch process, first string selection lower and upper gates 208d and 222d sequentially stacked are formed below the first string selection capping pattern 230d. The first string selection lower and upper gates 208d and 222d are formed in a symmetric structure to the first ground selection lower and upper gates 208a and 222a.

By the etch process, a control upper gate 222c is formed below the cell capping pattern 224c, and second ground selection gate line 230b and second string selection gate line 230e are formed below the second ground and string selection capping patterns 224b and 224e, respectively. The gate lines 230b and 230e are formed in the structure described in FIG. 15.

Thereafter, a photoresist pattern 226 is formed on the semiconductor substrate 200. The photoresist pattern 226 covers the second ground selection gate line 230b and the active region of both sides of the second ground selection gate line 230b. Also, the photoresist pattern 226 covers the second string selection gate line 230e, and the active region of both sides of the second string selection gate line 230e. At this time, the patterned second conductive layer 220 used as an etch stop layer is exposed.

Referring to FIG. 20, the second conductive layer 220 and the multi-layer charge storage layer 218 are successively etched using the capping patterns 224a, 224c and 224d and the photoresist pattern 226 as an etch mask. As a result, a first ground selection gate line 230a, a cell gate line 230c and a first string selection gate line 230d are formed. The first ground selection gate line 230a, the cell gate line 230c and the first string selection gate line 230d are formed in the structure described with reference to FIG. 15. At this time, a first intergate pattern of the first ground selection gate line 230a is formed as an edge of the patterned first conductive layer 220 and the multi-layer charge storage layer 218. Likewise, a second intergate pattern of the first string selection gate line 230d is formed as an edge of the patterned first conductive layer 220 and the multi-layer charge storage layer 218.

Thereafter, the photoresist pattern 226 is removed. Next, impurity ions are implanted into the active region using the gate lines 230a, 230b, 230c, 230d and 230e as a mask to form impurity diffusion layers 232s, 232e, 234, 236 and 238.

Next, an interlayer insulating layer covering an entire surface of the semiconductor substrate 200 is formed. Common source line 242 penetrating the interlayer insulating layer 240 and shown in FIG. 15 is formed. By doing so, the NAND flash memory device shown in FIG. 15 can be realized.

According to the above method of forming the NAND flash memory device, the first ground upper gate 222a is formed to cover the edges of the patterned second conductive layer 220 and the multi-layer charge storage layer 218. By doing so, the first intergate pattern is disposed leaning to one edge of the upper surface of the first ground selection lower gate 208a. As a result, the first ground selection gate line 230a can be formed in a minimum line width of the current design rule. Likewise, since the first string selection gate line 230d is symmetric in structure to the first ground selection gate line 230a, the first string selection gate line 230d can be also formed in a minimum line width. In addition, since the second ground and string selection gate lines 230b and 230e are defined only by a photolithography process, they 230b and 230e can be formed in a minimum line width of the design rule.

Next, a method of forming the NAND flash memory device shown in FIGS. 16, 17A and 17B will be described. This method is similar to the aforementioned method.

Figure 21A:
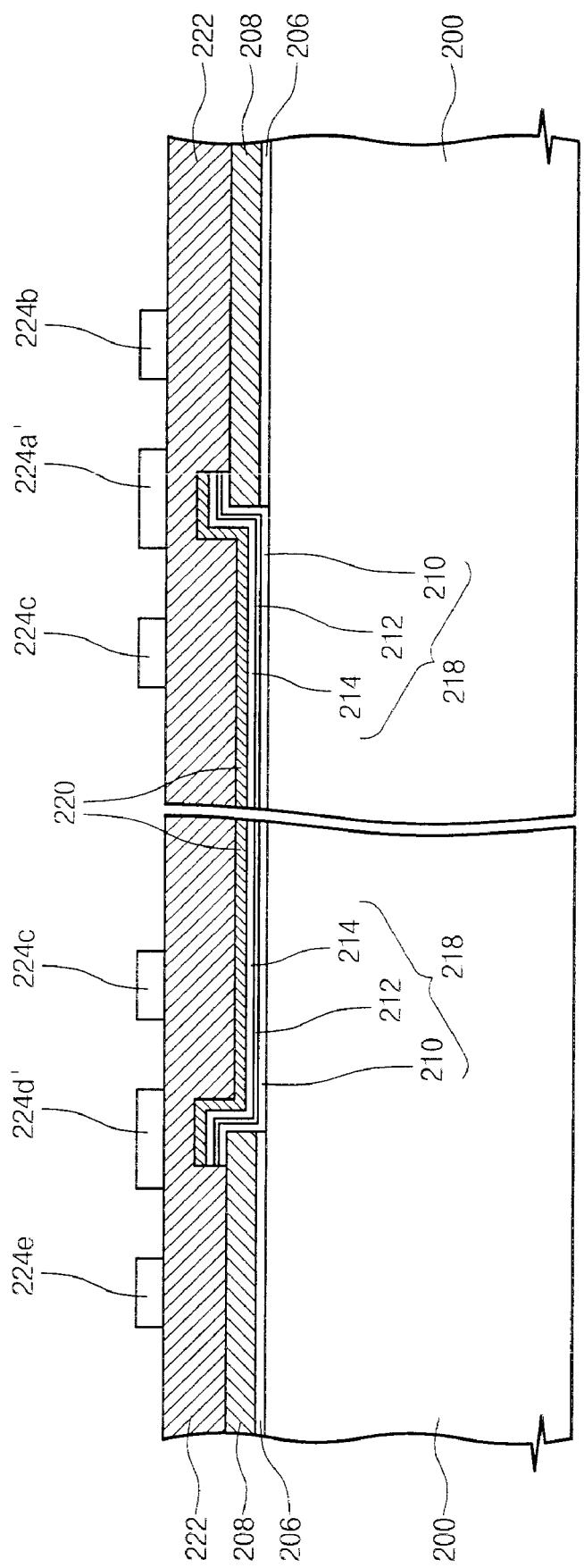
FIGS. 21A and 22A are cross-sectional views illustrating a method of forming the NAND flash memory device shown in FIG. 16.
Figure 21B:
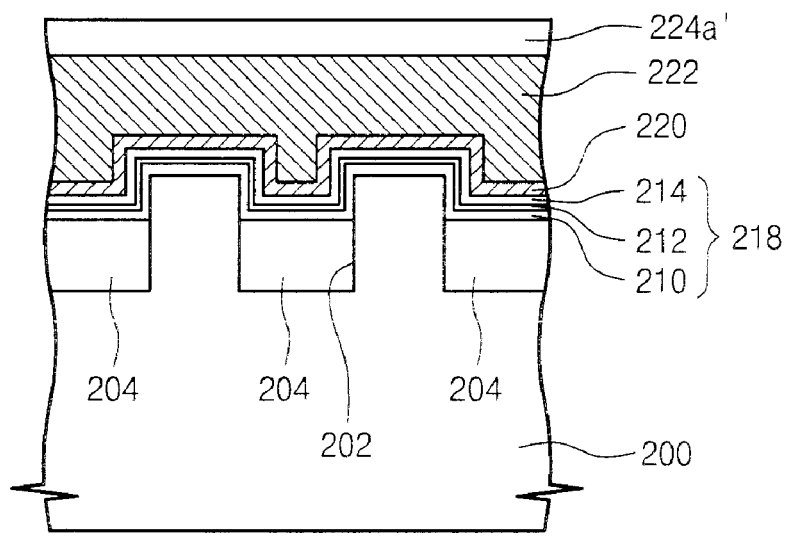
FIGS. 21B and 22B are cross-sectional views taken along the line V-V' of FIG. 16 to explain a method of forming the NAND flash memory device shown in FIG. 16.
Figure 21C:
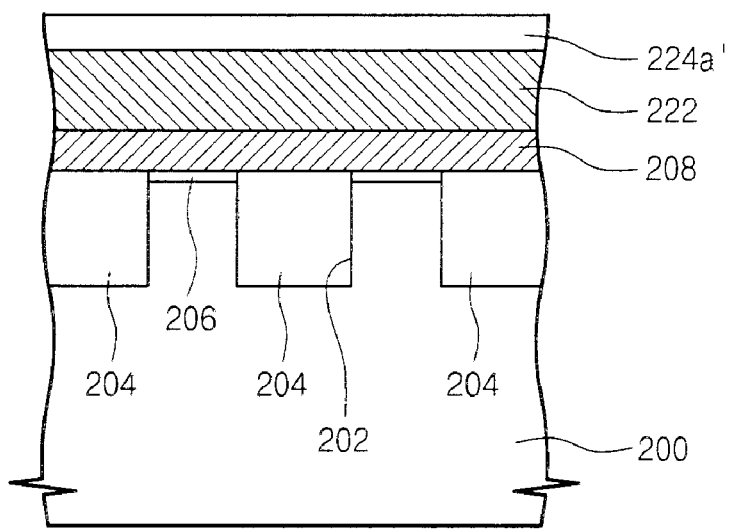
FIGS. 21C and 22C are cross-sectional views taken along the line VI-VI' of FIG. 16 to explain a method of forming the NAND flash memory device shown in FIG. 16.
Figure 22A:
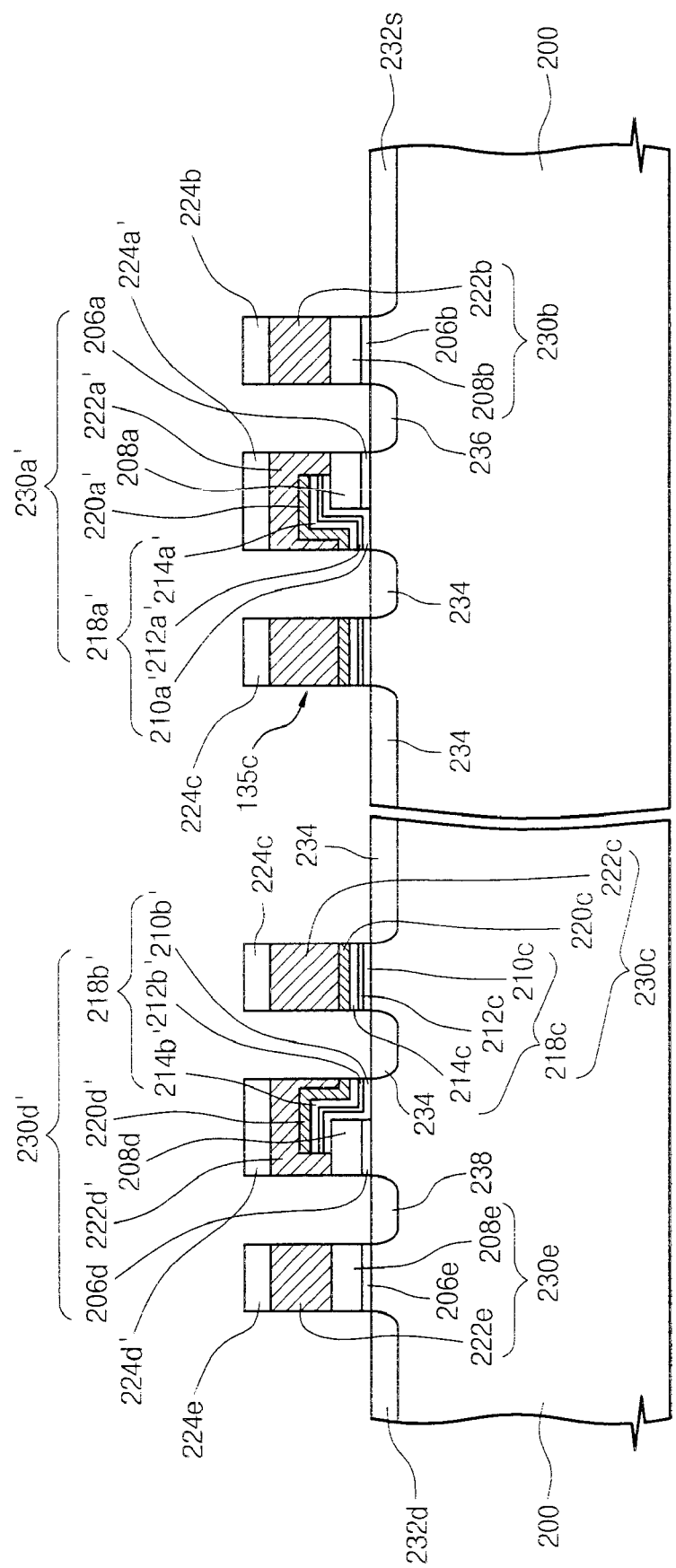
Figure 22B:
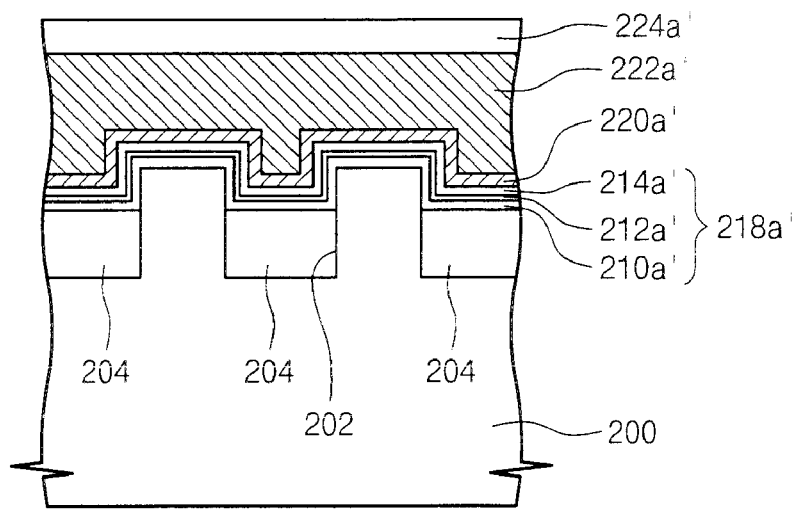
Figure 22C:
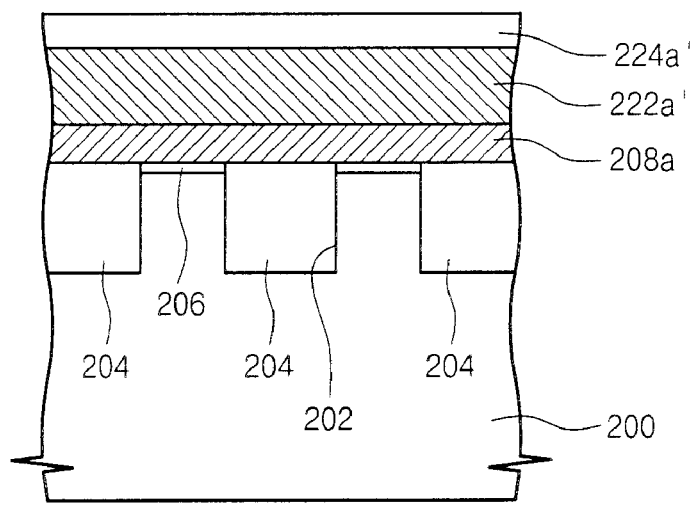

FIGS. 21A and 21B are cross-sectional views illustrating a method of forming the NAND flash memory device shown in FIG. 16, FIGS. 21B and 22B are cross-sectional views taken along the line V-V' of FIG. 16 to explain a method of forming the NAND flash memory device shown in FIG. 16, and FIGS. 21C and 22C are cross-sectional views taken along the line VI-VI' of FIG. 16 to explain a method of forming the NAND flash memory device shown in FIG. 16.

Referring to FIGS. 21A, 21B and 21C, third conductive layer 222 and capping layer can be formed in the same manner as in the aforementioned method.

Prior to forming the multi-layer charge storage layer 218 and the second conductive layer 220, after the first conductive layer 208 and the insulation layer 206 are patterned, the step of recessing the device isolation layer 204 using the patterned first conductive layer 208 as a mask can be further performed. Therefore, the multi-layer charge storage layer 218 and the second conductive layer 220 can fill the recessed portion of the device isolation layer 204. The device isolation layer 204 can fill a trench 202 formed in the semiconductor substrate.

The capping layer is patterned to form capping patterns 224a', 224b', 224c, 224d', and 224e. The first ground selection capping pattern 224a' covers an overlapping portion between the patterned second conductive layer 220 and the patterned first conductive layer 208, i.e., an edge of the patterned second conductive layer 220 and an edge of the patterned first conductive layer 208. Also, the first ground selection capping pattern 224a' cover a part of a contact portion between the third conductive layer 222 and the patterned first conductive layer 208. In addition, the first ground selection capping pattern 224a' extends laterally to cover a part of a contact portion between the active region of one side of the patterned first conductive layer 208 and the multi-layer charge storage layer 218. The first string selection capping pattern 224d' is formed in a symmetric structure to the first ground selection capping pattern 224a'.

Referring to FIGS. 22A, 22B and 22C, the third conductive layer 222, the second conductive layer 220, the charge storage layer 218, the first conductive layer 208 and the insulation layer 206 are successively etched using the capping patterns 224a', 224b, 224c, 224d' and 224e as a mask to form gate lines 230a', 230b, 230c, 230d' and 230e. The gate lines 230a', 230b, 230c, 230d' and 230e are formed in the structure described with reference to FIG. 16.

As described with reference to FIGS. 19 and 20, the gate lines 230a', 230b, 230c, 230d' and 230e can be formed by twice patterning processes using the second conductive layer 220 or the blocking insulation layer 218 as an etch stop layer.

Thereafter, impurity ions are implanted into the active region using the gate lines 230a', 230b, 230c, 230d' and 230e as a mask to form impurity diffusion layers 232s, 232d, 234, 236 and 238.

Thereafter, the interlayer insulating layer of FIG. 16 and common source line 242 are formed to realize the NAND flash memory device shown in FIG. 16.

THIRD EMBODIMENT

The present embodiment discloses first and second ground selection transistors different than those of the first and second embodiments. According to the present embodiment, channel regions of the first and second ground selection transistors are directly connected with each other.

Figure 23:
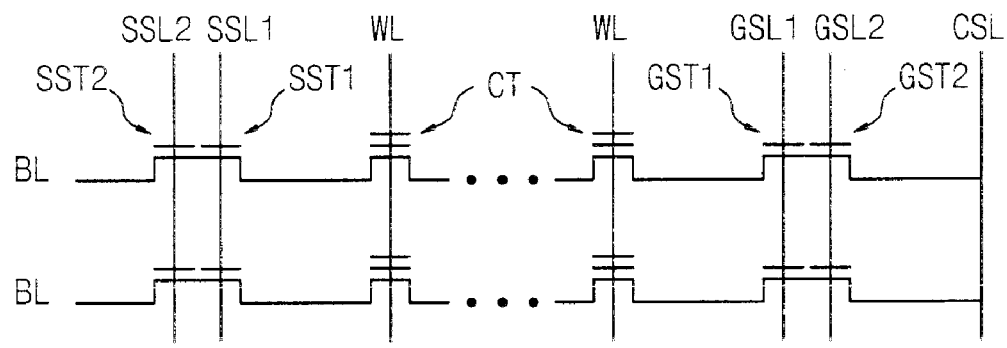
FIG. 23 is an equivalent circuit diagram of a NAND flash memory device according to another embodiment of the present invention.

FIG. 23 is an equivalent circuit diagram of a NAND flash memory device according to another embodiment of the present invention.

Referring to FIG. 23, a plurality of cell strings are arranged in parallel. Each of the cell strings includes a cell group consisting of a plurality of cell transistors 'CT' connected in series. The cell transistor 'CT' includes a charge storage means. First and second ground selection transistors 'GST1 and GST2' are sequentially connected in series to one end of the cell group. First and second string selection transistors 'SST1 and SST2' are sequentially connected in series to the other end of the cell group. In further detail, the first ground selection transistor 'GST1' and the first string selection transistor 'SST1' are respectively connected in series to both ends of the cell group.

A first channel region of the first ground selection transistor 'GST1' is directly connected with a second channel region of the second ground selection transistor 'GST2'. Therefore, a source of the first ground selection transistor 'GST1' and a drain of the second ground transistor 'GST2' are omitted.

A third channel region of the first string selection transistor 'SST1' can be directly connected with a fourth channel region of the second string selection transistor 'SST2'. Therefore, a source of the first string selection transistor 'SST1' and a drain of the second string transistor 'SST2' are omitted.

A NAND flash memory device according to the present embodiment can include the first and second ground selection transistors 'GST1 and GST2' and one string selection transistor. Alternatively, the NAND flash memory device can include the first and second string selection transistors 'SST1 and SST2' and one ground selection transistor.

A source of the second ground selection transistor 'GST2' is connected to a common source line 'CSL'. The common source line 'CSL' can be commonly connected to the second ground selection transistors 'GST2' of the plurality of cell strings. A bit line 'BL' is connected to one end of the second string selection transistor 'SST2'. The bit line 'BL' is connected to the cell string one-to-one.

Gates of the first ground selection transistors 'GST1' arranged in a column direction are connected to a ground selection line 'GSL1', and gates of the second ground selection transistors 'GST2' arranged in the column direction are connected to a second ground selection line 'GSL2'. Gates of the cell transistors 'CT' arranged in the column direction are connected to a word line 'WL'. Gates of the first string selection transistors 'SST1' arranged in the column direction are connected to a first string selection line 'SSL1', and gates of the second string selection transistors 'SST2' arranged in the column direction are connected to the second string selection line 'SSL2'.

A programming method of the aforementioned NAND flash memory device will now be described.

A ground voltage is applied to the common source line 'CSL' and the second ground selection line 'GSL2, and a constant voltage is applied to the first ground selection line (GSL1). As a result, the first ground selection transistor 'GST1' is turned on, and the second ground selection transistor 'GST2' is turned off.

The constant voltage is applied to the first and second string selection lines 'SSL1 and SSL2'. The ground voltage is applied to the bit line 'BL' connected to a selected cell transistor 'CT', and the constant voltage is applied to non-selected bit lines 'BL'. A programming voltage is applied to the word line 'WL' to which the selected cell transistor 'CT' is connected. A pass voltage is applied to non-selected word lines 'WL'

As a result, the ground voltage is applied to the channel region of the selected cell transistor 'CT', and the programming voltage is applied to the gate of the selected cell transistor 'CT' to program the selected cell transistor.

Meanwhile, the channel of the non-selected cell transistor 'CT' sharing the word line 'WL' connected to the selected cell transistor 'CT' is boosted. The boosted channel voltage is applied to the drain of the first ground selection transistor 'GST1' via the neighboring cell transistor 'CT'. Since the constant voltage is applied to the gate of the ground selection transistor 'GST1', the boosted channel voltage is reduced by the first ground selection transistor 'GST1'. At this time, the channel regions of the first and second ground selection transistors 'GST1 and GST2' are connected directly with each other. To this end, the first ground selection transistor 'GST1' directly transmits the reduced voltage (which is obtained by subtracting a threshold voltage of the first ground selection transistor 'GST1' from the constant voltage) to the channel of the second ground selection transistor 'GST2'. By doing so, the leakage current through the second ground selection transistor can be minimized.

Also, the first string selection transistor 'SST1' can perform the function as a buffer for the boosted channel voltage to thereby minimize the leakage current through the second string selection transistor 'SST2'.

The aforementioned NAND flash memory device does not require the source of the first ground selection transistor 'GST1' and the drain of the second ground selection transistor 'GST2'. Also, it does not require the drain of the first string selection transistor 'SST1' and the source of the second string selection transistor 'SST2'. By doing so, the leakage current due to the boosted channel voltage is minimized and at the same time a more highly integrated NAND flash memory device can be realized.

A structure of the aforementioned NAND flash memory device will now be described with reference to FIGS. 24, 25A, 25B and 25C.

Figure 24:
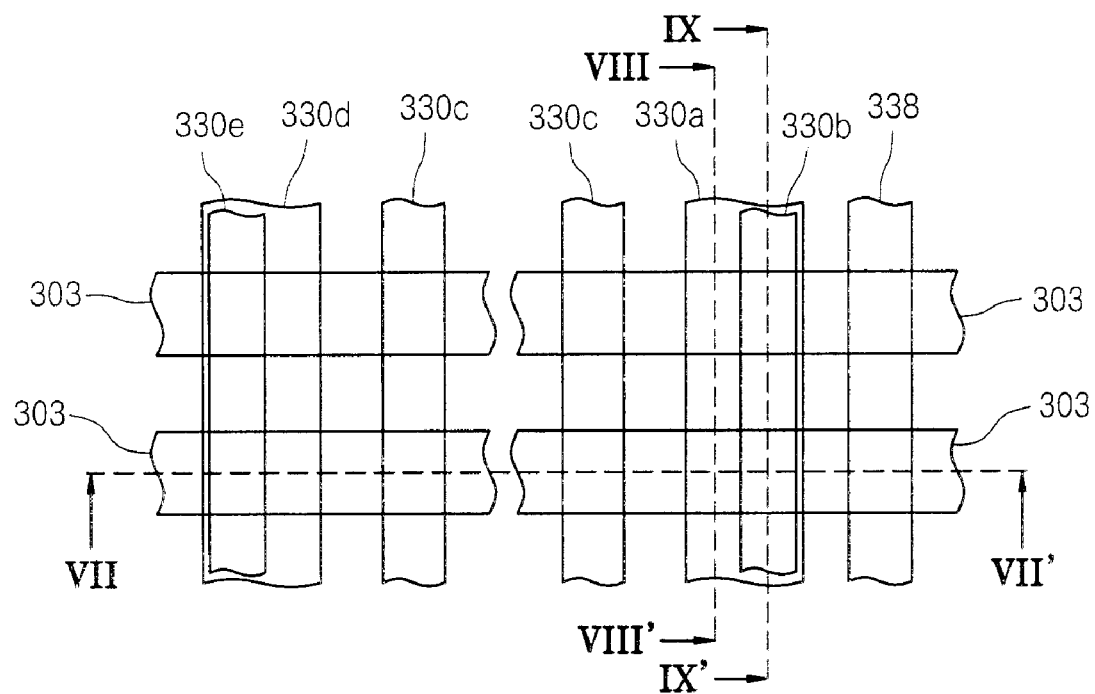
FIG. 24 is a plan view of a NAND flash memory device according to still another embodiment of the present invention.
Figure 25A:
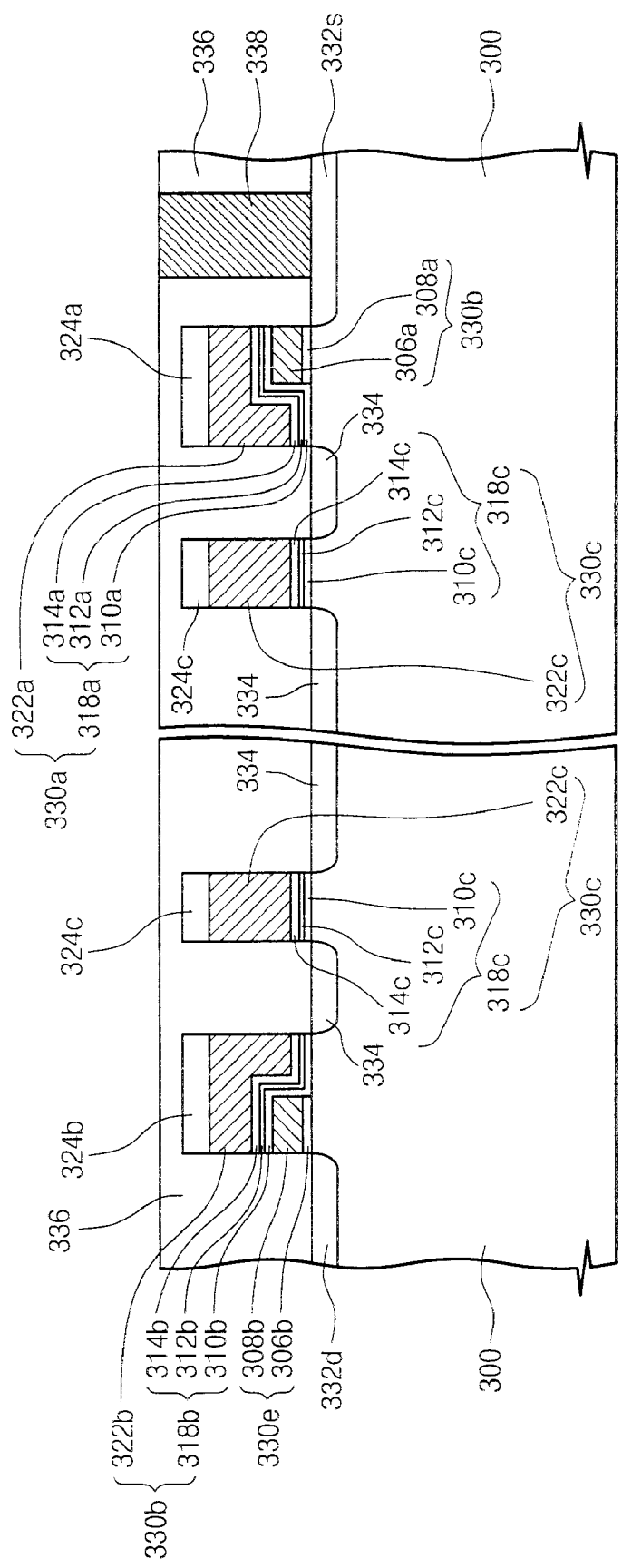
FIGS. 25A, 25B and 25C are cross-sectional views taken along the lines VII-VII', VIII-VIII' and IX-IX' of FIG. 24, respectively.
Figure 25B:
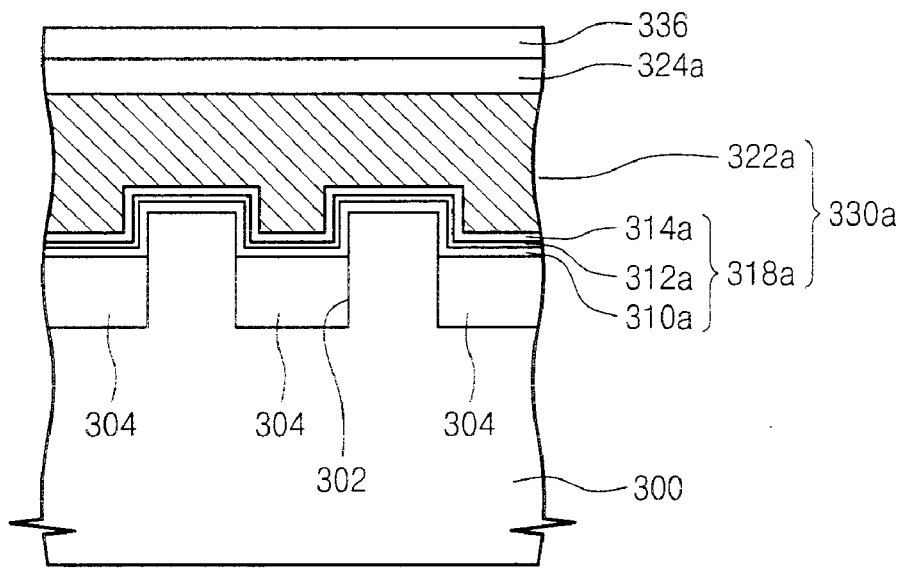
Figure 25C:
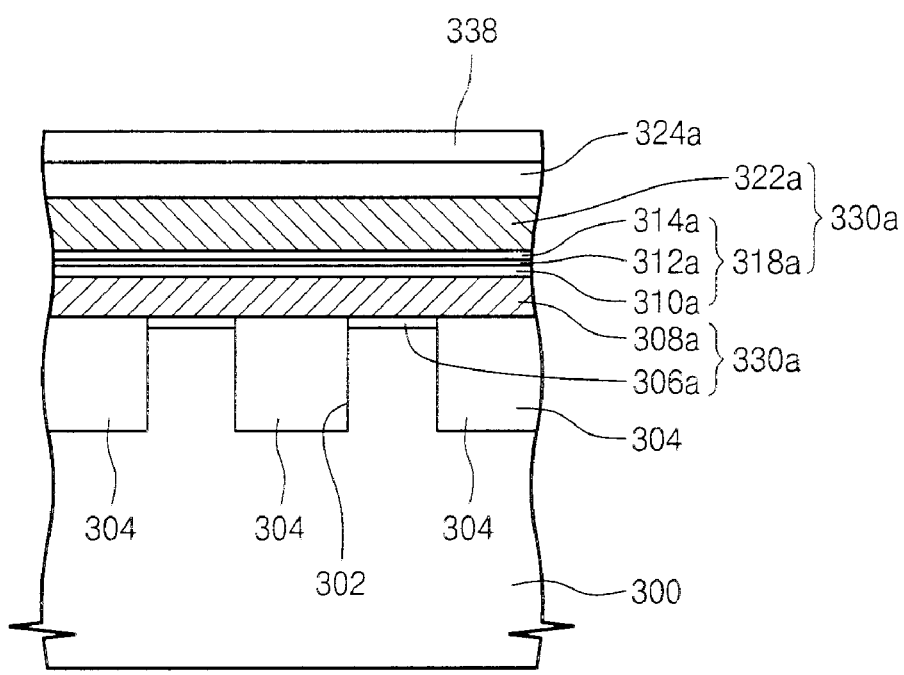

FIG. 24 is a plan view of a NAND flash memory device according to still another embodiment of the present invention, and FIGS. 25A, 25B and 25C are cross-sectional views taken along the lines VII-VII', VIII-VIII' and IX-IX' of FIG. 24, respectively.

Referring to FIGS. 24, 25A, 25B and 25C, a device isolation layer 304 defining an active region 303 is disposed in a semiconductor substrate 300. The device isolation layer 304 fills a trench 302 formed in the semiconductor substrate 300.

A plurality of cell gate lines 330c cross over the active regions 303 in parallel. The plurality of cell gate lines 330c constitute a cell gate group. A first ground selection gate lines 330a crosses over the active regions 303 disposed at one side of the cell gate group. A second ground selection gate line 330b is disposed at one side of the first ground selection gate line 330a to cross the active regions 303 of an opposite side of the cell gate group. At this time, a first channel region below the first ground selection gate line 330a is directly connected with a second channel region below the second ground selection gate line 330b. The first ground selection gate line 330c is spaced apart from the cell gate line 330c, and the second ground selection gate line 330b is adjacent to the first ground selection gate line 330a.

A first string selection gate line 330d is disposed at the other side of the cell gate group to cross over the active regions 303 of an opposite side of the first ground selection gate line 330a. A second string selection gate line 330e is disposed at one side of the first string selection gate line 330d to cross over the active regions 303 of an opposite side of the first string selection gate line 330d. At this time, it is preferable that a third channel region below the first string selection gate line 330d be directly connected with a fourth channel region below the second string selection gate line 330e.

The first ground selection gate line 330a includes a first ground selection gate insulation pattern 318a and a first ground selection gate electrode 322a sequentially stacked, and the second ground selection gate line 330b includes a second ground selection gate insulation pattern 306a and a second ground selection gate electrode 308a sequentially stacked.

Each of the first ground selection gate line 330a and the second ground selection gate line 330b has first sidewalls adjacent to the cell gate line 330c and second sidewalls disposed at an opposite side of the first sidewalls.

The first ground selection gate electrode 322a extends to cover the first sidewall and an upper surface of the second ground selection gate line 330b. At this time, the first ground selection gate insulation pattern 318a also extends to be interposed between the first ground selection gate electrode 322a and the first sidewall and the upper surface of the second ground selection gate line 330b. By doing so, the first ground selection gate electrode 322a is insulated from the second ground selection gate electrode 308a by the first ground selection gate insulation pattern 318a.

The second sidewall of the first ground selection gate line 330a is aligned with the second sidewall of the second ground selection gate line 330b.

By interposing only the first ground selection gate insulation pattern 318a, the first channel region is defined below the first ground selection gate electrode 322a disposed on the active region 303, and the second channel region is defined below the second ground selection gate electrode 308a. As shown in FIG. 25A, the first and second channel regions are connected directly with each other.

It is preferable that the first ground selection gate insulation pattern 318a be thicker than the second ground selection gate insulation pattern 306a. Therefore, the first ground selection transistor including the first ground selection gate line 330a has a threshold voltage higher than the second ground selection transistor including the second ground selection gate line 330b. At this time, it is preferable that the threshold voltage of the first ground selection transistor be lower than the constant voltage.

An upper surface of the device isolation layer 304 includes a first portion which is lower than an upper surface of the semiconductor substrate 300, and a second portion which is equal in height to or higher than the upper surface of the semiconductor substrate 300. At this time, the portion that contacts the active region 303 of the first ground selection gate line 330a extends to fill a recessed portion generated by the first portion of the upper surface of the device isolation layer. The second ground selection gate line 330b extends over the second portion of the upper surface of the device isolation layer 304.

The cell gate line 330c includes a multi-layer charge storage pattern 318c and a control gate electrode 322c sequentially stacked. The multi-layer charge storage pattern 318c includes a tunnel insulation pattern 310c, a charge storage pattern 312c, and a blocking insulation pattern 314c sequentially stacked. The tunnel insulation pattern 310c can be made of a silicon oxide and especially of a thermal oxide. The charge storage pattern 312c can be made of an insulation layer (for example, silicon nitride or the like) having a deep level trap, a silicon dot layer, a metal dot layer, and/or a silicon germanium dot layer. The blocking insulation pattern 314c can be made of an insulator (for example, a metal oxide insulator, such as hafnium oxide, aluminum oxide or the like) having a higher dielectric constant than the tunnel insulation pattern 310c. The control gate electrode 322c can include at least one selected from the group consisting of a conductive doped polysilicon, a metal (for example, tungsten (W), molybdenum (Mo), etc.), a conductive metal nitride (for example, titanium nitride, tantalum nitride, etc.) and a metal silicide (for example, tungsten silicide, cobalt silicide, etc.).

The first ground selection gate electrode 322a can be made of the same material as the control gate electrode 322c. The first ground selection gate insulation layer 318a can be made of the same material as the multi-layer charge storage pattern 318c. In other words, the first ground selection gate insulation layer 318a includes first, second and third layers 310a, 312a and 314a sequentially stacked, and the first, second and third layers 310a, 312a and 314a can be made of the same material as the tunnel insulation pattern 310c, the charge storage pattern 312c and the blocking insulation pattern 314c, respectively. Alternatively, the first ground selection gate insulation layer 318a can be made of a silicon oxide which is thicker than the second ground selection gate insulation layer 306a.

The second ground selection gate insulation pattern 306a can be made of a silicon oxide and especially of a thermal oxide. The second ground selection gate electrode 308a can includes at least one selected from the group consisting of a conductive doped polysilicon, a metal (for example, tungsten (W), molybdenum (Mo), etc.), a conductive metal nitride (for example, titanium nitride, tantalum nitride, etc.) and a metal silicide (for example, tungsten silicide, cobalt silicide, etc.).

It is preferable that the first and second string selection gate lines 330d and 330e be symmetric to the first and second ground selection gate lines 330a and 330b. The first string selection gate line 330d includes a first string selection gate insulation pattern 318b and a first string selection gate electrode 322b sequentially stacked on the semiconductor substrate 300, and the second string selection gate line 330e includes a second string selection gate insulation pattern 306b and a second string selection gate electrode 308b sequentially stacked on the semiconductor substrate 300.

Each of the first and second string selection gate lines 330d and 330e has first sidewalls adjacent to the cell gate line 330c, and second sidewalls disposed at an opposite side of the first sidewalls. The first string selection gate electrode 322d extends to cover the first sidewall and an upper surface of the second string selection gate line 330e. At this time, the first string selection gate insulation pattern 318b extends to be interposed between the first string selection gate electrode 322b and the second string selection gate electrode 308b. By doing so, the first and second string selection gate electrodes 322b and 308b are insulated from each other. The second sidewalls of the first string selection gate line 330d are aligned with the second sidewalls of the second string selection gate line 330e.

It is preferable that the first and second string selection gate insulation patterns 318b and 306b be made of the same material as the first and second ground selection gate insulation patterns 318a and 306a, respectively. It is preferable that the first and second string selection gate electrodes 322b and 308b be made of the same material as the first and second ground selection gate electrodes 322a and 308a, respectively.

A ground selection capping pattern 324a is disposed on the first ground selection gate line 330a, and a string selection capping pattern 324d is disposed on the first string selection gate line 330d. A cell capping pattern 324c is disposed on the cell gate line 330c. Since the ground selection capping pattern 324a is disposed on the first ground selection gate line 330a, it covers the second ground selection gate line 330b. Likewise, the ground selection capping pattern 324b covers the second ground selection gate line 330e. The capping patterns 324a, 324b and 324c can be made of an insulator having an etch selectivity with respect to the gate lines 330a, 330b, 330c, 330d and 330e, for example, of a silicon nitride.

Impurity diffusion layers 332s, 332d and 334 are disposed in the active region 303 at one side of the first ground selection gate line 330a, at one side of the second ground selection gate line 330b, at both sides of the cell gate line 330c, at one side of the first string selection gate line 330d, and at one side of the second string selection gate line 330e.

The first impurity diffusion layer 332s is formed in the active region 303 which is disposed at one side of the second ground selection gate line 330b and is an opposite side of the first ground selection gate line 330a and it corresponds to a common source region 332s. The second impurity diffusion layer 232d is formed in the active region which is disposed at one side of the second string selection gate line 330e and is an opposite side of the first string selection gate line 330d and it corresponds to a common drain region 332d. The third impurity diffusion layer 334 formed in the active region 303 at both sides of the cell gate line 330c corresponds to a source/drain region of the cell transistor. In particular, the third impurity diffusion layer 334 between the first ground selection gate line 330a and the cell gate line 330c adjacent thereto corresponds to the drain of the first ground selection transistor. At this time, since the first and second channel regions are connected with each other, a source of the first ground selection transistor is not required. Also, a drain of the second ground selection transistor is not required. Likewise, the third impurity diffusion layer 334 between the first string selection gate line 330d and the cell gate line 330c adjacent thereto corresponds to the source of the first string selection transistor. At this time, since the third and fourth channel regions are connected with each other, a drain of the first string selection transistor and a source of the second string selection transistor are not required.

An interlayer insulating layer 336 covers the entire surface of the semiconductor substrate 300. A common source line 338 penetrating the interlayer insulating layer 336 is connected with the common source region 332s.

Although not shown in the drawings, likewise in the aforementioned first embodiment, another interlayer insulating layer can be disposed on the interlayer insulating layer 336 and a bit line can be disposed on the another interlayer insulating layer. The bit line can be connected to the common drain region 232d via a contact plug penetrating the interlayer insulating layers.

Figure 26A:
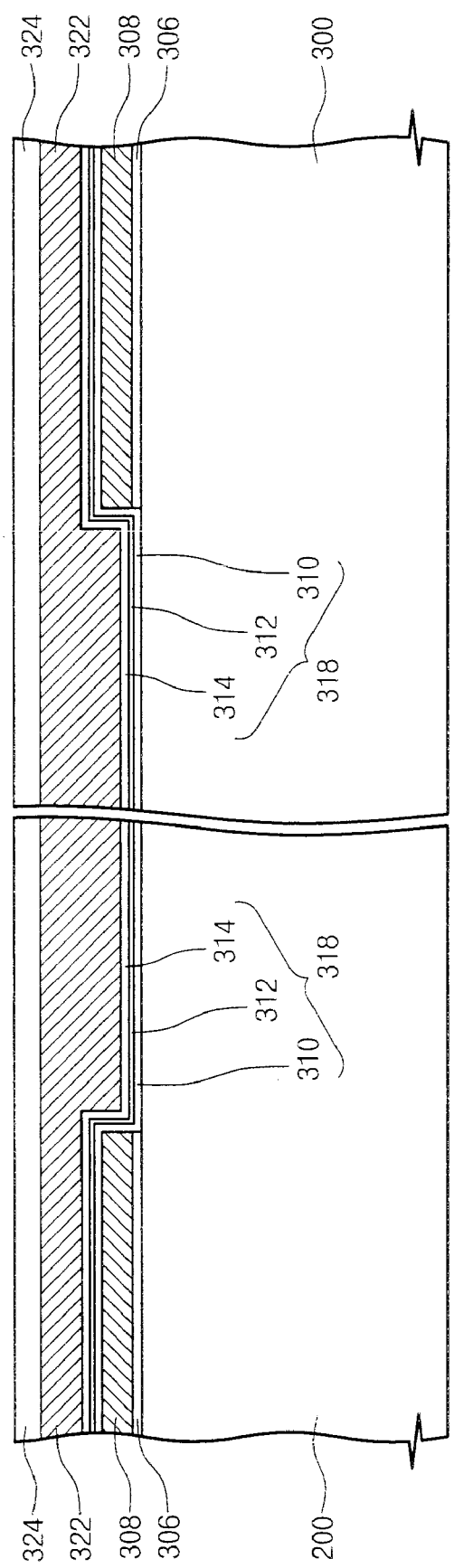
Figure 26B:
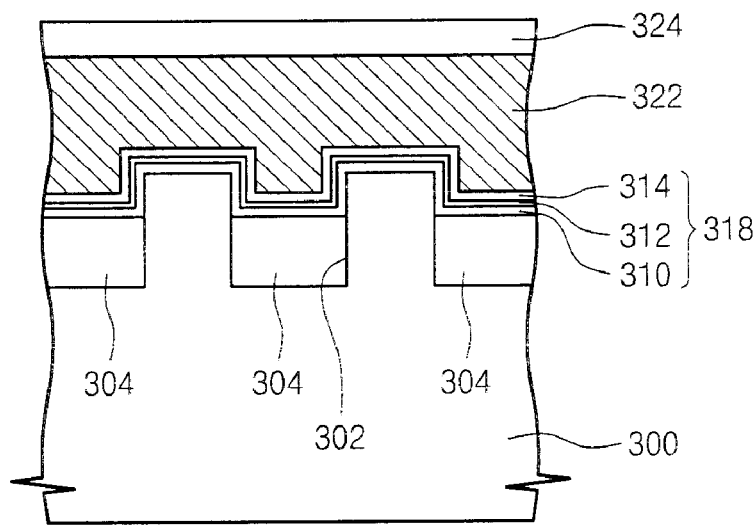
FIGS. 26B and 27B are cross-sectional views taken along the line VIII-VIII' of FIG. 24 to explain a method of forming the NAND flash memory device according to still another embodiment of the present invention.
Figure 26C:
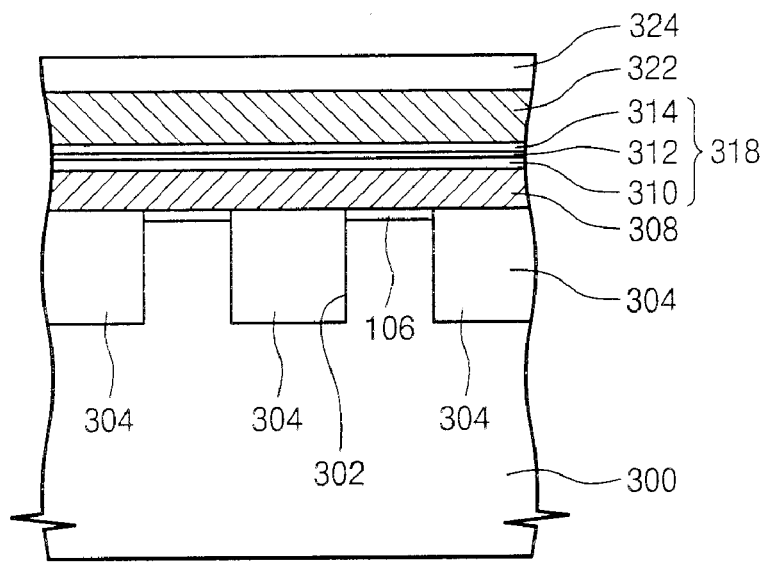
FIGS. 26C and 27C are cross-sectional views taken along the line IX-IX' of FIG. 24 to explain a method of forming the NAND flash memory device according to still another embodiment of the present invention.
Figure 27B:
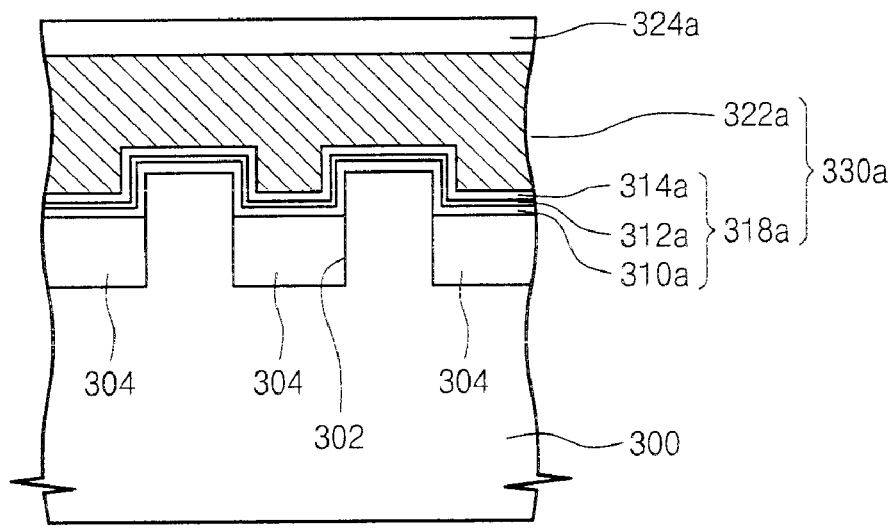
Figure 27C:
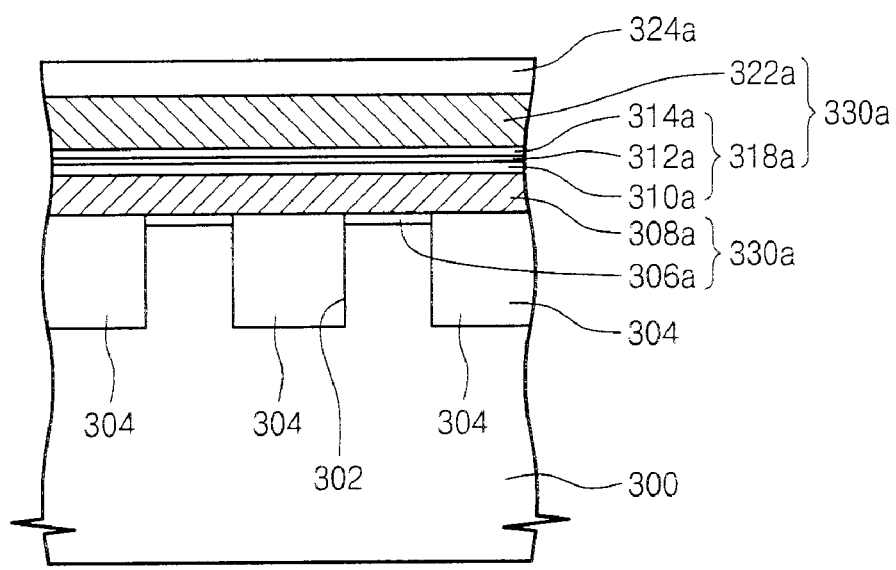

FIGS. 26A and 27A are cross-sectional views taken along the line VII-VII' of FIG. 24 to explain a method of forming the NAND flash memory device according to still another embodiment of the present invention. FIGS. 26B and 27B are cross-sectional views taken along the line VIII-VIII' of FIG. 24 to explain the method, and FIGS. 26C and 27C are cross-sectional views taken along the line IX-IX' of FIG. 24 to explain the method.

Referring to FIGS. 26A, 26B and 26C, a device isolation layer 304 is formed in a semiconductor substrate to define the active region 303 of FIG. 24. The device isolation layer 304 can fill a trench 302 formed in the semiconductor substrate 300.

An insulation layer 306 and a first conductive layer 308 are sequentially formed on the semiconductor substrate 300. The first conductive layer 308 and the insulation layer 306 are successively patterned to expose a predetermined portion of the active region 303. The exposed active region 303 includes a region where cell gate lines are subsequently formed. Edges of the patterned first conductive layer 308 and the insulation layer 306 cover regions where ground selection and string selection gate lines are subsequently formed.

The insulation layer 306 can be formed of a silicon oxide, and especially of a thermal oxide. The first conductive layer 306 can include at least one selected from the group consisting of a doped polysilicon, a metal (for example, tungsten (W), molybdenum (Mo), etc.), a conductive metal nitride (for example, titanium nitride, tantalum nitride, etc.) and a metal silicide (for example, tungsten silicide, cobalt silicide, etc.).

Next, the device isolation layer 304 can be recessed using the patterned first conductive layer 308 as a mask. As a result, an upper surface of the recessed device isolation layer at both sides of the exposed active region is lower than the upper surface of the semiconductor substrate 300. Since a portion covered by the patterned first conductive layer of the device isolation layer 304 is not recessed, it has an upper surface which is equal in height to or higher than the upper surface of the semiconductor substrate 300.

A multi-layer charge storage layer 318 and a second conductive layer 322 are sequentially formed on an entire surface of the semiconductor substrate 300. The multi-layer charge storage layer 318 and the second conductive layer 322 fill the recessed portion of the device isolation layer 304.

The multi-layer charge storage layer 318 includes a tunnel insulation layer 310, a charge storage layer 312 and a blocking insulation layer 314 sequentially stacked. The tunnel insulation layer 310 can be formed of a silicon oxide and especially of a thermal oxide. The charge storage layer 312 can be formed of an insulator (for example, silicon nitride) having deep level traps, a silicon dot layer, a metal dot layer and/or a silicon germanium dot layer. The blocking insulation layer 314 can be formed of an insulation layer having a higher dielectric constant than the tunnel insulation layer 310, for example, a metal oxide insulator, such as a hafnium oxide, aluminum oxide or the like. The second conductive layer 322 can be formed of at least one selected from the group consisting of a doped polysilicon, a metal (for example, tungsten, molybdenum, etc.), a conductive metal nitride (for example, titanium nitride, tantalum nitride, etc.), and a metal silicide (for example, tungsten silicide, cobalt silicide, etc.).

A capping layer 324 is formed on the second conductive layer 324. The capping layer 324 can be formed of an insulator that can be used as a hard mask. For example, the capping layer 324 can be formed of a silicon nitride.

The capping layer 324 is patterned to form capping patterns 324a, 324b and 324c arranged in parallel on the second conductive layer 322. The cell capping patterns 324c are arranged in parallel on a contact region between the multi-layer charge storage layer 318 and the active region, the ground selection capping pattern 324a is disposed at one side of the cell capping patterns 324c and spaced apart from the cell capping patterns 324c, and the string selection capping pattern 324b is disposed at the other side of the cell capping patterns 324c and spaced apart from the cell capping patterns 324c.

The ground selection capping pattern 324a simultaneously covers an edge of the patterned first conductive layer 308, and some of a contact portion between the multi-layer charge storage layer disposed adjacent to the edge of the patterned first conductive layer 308, and the active region. Likewise, the string selection capping pattern 324b covers another edge of the patterned first conductive layer and some of a contact portion between the multi-layer charge storage layer 318 disposed adjacent to the other edge of the patterned first conductive layer 308, and the active region.

The second conductive layer 322, the multi-layer charge storage layer 318, the patterned first conductive layer 308 and the patterned insulation layer are successively etched using the capping patterns 324a, 324b and 324c as an etch mask to form gate lines 330a, 330b, 330c, 330d and 330e. The gate lines 330a, 330b, 330c, 330d and 330e are formed in the structure described with reference to FIGS. 25A, 25B and 25C.

Impurity ions are implanted into the active region using the gate lines 330a, 330b, 330c, 330d and 330e as a mask to form impurity diffusion layers 332s, 332d and 334. The impurity diffusion layers 332s, 332d and 334 perform the functions and roles described with reference to FIGS. 25A, 25B and 25C. The first impurity diffusion layer 332s corresponds to a common source region 332s and the second impurity diffusion layer 332d corresponds to a common drain region 332d.

Next, the interlayer insulating layer 336 of FIG. 25A covering the entire surface of the semiconductor substrate 300 is formed, and the common source line 338 of FIG. 25A penetrating the interlayer insulating layer 336 to be connected with the common source region 332s is formed. By doing so, the NAND flash memory device shown in FIGS. 25A, 25B and 25C can be realized.

As described above, the NAND flash memory device according to the present invention includes first and second transistors sequentially connected in series. At this time, the first and second transistors can be first and second ground selection transistors or first and second string selection transistors. The first selection transistor can reduce a boosted channel voltage of a non-selected cell, or serve as a buffer for the boosted channel voltage to minimize a leakage current through the second selection transistor. By doing so, the leakage current of the NAND flash memory due to the conventional boosted channel voltage can be minimized.

Also, the first selection gate line included in the first selection transistor includes the first selection lower and upper gates sequentially stacked and connected with each other, and the first intergate pattern interposed between the first selection lower and upper gates. At this time, the first intergate pattern is disposed leaning toward one edge of the upper surface of the first selection lower gate, and the first selection upper gate covers one sidewall of the first intergate pattern and simultaneously contacts some of the upper surface of the first selection lower gate. Therefore, the first selection gate line is formed in a minimum line width of the present design rule, and the first selection lower and upper gates can be connected with each other. In addition, according to one embodiment of the present invention, the first channel region below the first selection gate line is directly connected with the second channel region below the second selection gate line. Therefore, a source of the first selection transistor and a drain of the second selection transistor are not required. As a result, the leakage current due to a boosted channel voltage of a non-selected cell can be minimized and a more highly integrated flash memory device can be realized.

It will be apparent to those skilled in the art that various modifications and variations can be made in the present invention. Thus, it is intended that the present invention covers the modifications and variations of this invention provided they come within the scope of the appended claims and their equivalents.

What is claimed is:
1. A NAND flash memory device comprising:
a device isolation layer formed in a semiconductor substrate to define an active region;
a cell gate group including a plurality of cell gate lines arranged in parallel with each other on the active region;
a first selection gate line disposed on the active region of one side of the cell gate group, and including a first selection lower gate and a first selection upper gate sequentially stacked and connected with each other, and a first intergate pattern interposed between the first selection lower gate and the first selection upper gate;
a second selection gate line disposed on the active region of one side of the first selection gate line, the first selection gate line disposed between the cell gate group and the second selection gate line; and first impurity diffusion layers respectively formed at the active region of both sides of each of the cell gate lines, a second impurity diffusion layer formed at the active region between the first selection gate line and the second selection gate line, and a third impurity diffusion layer disposed at the active region of one side of the second selection gate line wherein the second selection gate line is disposed between the second and third impurity diffusion layer, and the third impurity diffusion layer is one of a common source region and a common drain region.

2. The NAND flash memory device of claim 1, wherein the cell gate lines comprise a tunnel insulation pattern, a floating gate, a blocking insulation pattern and a control gate electrode sequentially stacked, and the control gate electrode comprises a control lower gate and a control upper gate sequentially stacked.

3. The NAND flash memory device of claim 2, wherein each of the first selection lower gate, the first intergate pattern and the first selection upper gate has a first sidewall adjacent to the cell gate group and a second sidewall opposite to the first sidewall, the first sidewall of the first selection lower gate, the first sidewall of the first intergate pattern and the first sidewall of the first selection upper gate are aligned with one another, the first selection upper gate contacts the second sidewall of the first intergate pattern and a part of an upper surface of the first selection lower gate, and the second sidewall of the first selection lower gate and the second sidewall of the first selection upper gate are aligned with each other.

4. The NAND flash memory device of claim 3, wherein the first selection lower gate is made of the same material as the floating gate, the first selection upper gate is made of the same material as the control upper gate, and the first intergate pattern is made of the same material as the blocking insulation pattern and the control lower gate.

5. The NAND flash memory device of claim 1, wherein the device isolation layer has an upper surface, which is lower than an upper surface of the semiconductor substrate to form a recessed portion, further comprises a residual pattern partially formed in the recessed portion, the first intergate pattern extends to partially fill the recessed portion, the first selection upper gate partially extends to pass over the residual pattern, and the residual pattern is made of the same material as the first intergate pattern.

6. The NAND flash memory device of claim 1, wherein the second selection gate line comprises:

a second selection lower gate and a second selection upper gate sequentially stacked and connected with each other; and a second intergate pattern interposed between the second selection lower gate and the second selection upper gate, wherein the second selection lower and upper gates are made of the same material as the first selection lower and upper gates, respectively; and the second intergate pattern is made of the same material as the first intergate pattern.

7. The NAND flash memory device of claim 1, wherein the second selection gate line has a structure symmetric to the first selection gate.

8. The NAND flash memory device of claim 1, wherein the second selection gate line comprises a second selection lower gate and a second selection upper gate sequentially stacked and connected with each other;

the second selection lower and upper gates are made of the same material as the first selection lower and upper gates, respectively; and the second selection lower gate has an upper surface all of which contacts the second selection upper gate.

9. The NAND flash memory device of claim 1, wherein the cell gate lines comprise a multi-layer charge storage pattern and a control gate electrode sequentially stacked, the control gate electrode comprises a control lower gate and a control upper gate sequentially stacked, and the multi-layer charge storage pattern comprises a tunnel insulation pattern, a charge storage pattern and a blocking insulation pattern sequentially stacked.

10. The NAND flash memory device of claim 9, wherein the first intergate pattern comprises the same material as that of the multi-layer charge storage pattern.

11. The NAND flash memory device of claim 9, wherein each of the first selection lower gate, the first intergate pattern and the first selection upper gate has a first sidewall adjacent to the cell gate group and a second sidewall opposite to the first sidewall;

the first sidewall of the first intergate pattern and the first sidewall of the first selection upper gate are aligned with each other;

the first selection upper gate contacts the second sidewall of the first intergate pattern and a part of an upper surface of the first selection lower gate; and the second sidewall of the first selection lower gate and the second sidewall of the first selection upper gate are aligned with each other.

12. The NAND flash memory device of claim 11, wherein the first selection lower gate has a width that is wider than that of the first selection upper gate.

13. The NAND flash memory device of claim 11, wherein the first selection upper gate laterally extends toward the cell gate group to cover the first sidewall of the first selection lower gate and a part of the active region, the first intergate pattern laterally extends to be interposed between the first selection upper gate and the first sidewall of the first selection lower gate and between the first selection upper gate and the active region, and the first intergate pattern comprises an insulator.

14. The NAND flash memory device of claim 13, wherein the first intergate pattern comprises the same material as that of the multi-layer charge storage pattern.

15. The NAND flash memory device of claim 13, wherein the device isolation layer has an upper surface including a first portion which is lower than an upper surface of the semiconductor substrate, and a second portion which is equal in height to or higher than the upper surface of the semiconductor substrate, wherein a portion covering the active region of the first intergate pattern extends to fill a recessed portion formed by the first portion of the upper surface of the device isolation layer, and a contact portion of the first selection lower and upper gates extends to pass over the second portion of the upper surface of the device isolation layer.

16. The NAND flash memory device of claim 1, further comprising:

a third selection gate line disposed on the active region of the other side of the cell gate group, the cell gate group disposed between the first and third selection gate line;

a fourth selection gate line disposed on the active region of one side of the third selection gate line, the third selection gate line disposed between the cell gate group and the fourth selection gate line;

a fourth impurity diffusion layer formed at the active region between the third selection gate line and the fourth selection gate line; and a fifth impurity diffusion layer disposed at the active region of one side of the fourth selection gate line and being opposite to the fourth impurity diffusion layer, wherein one of the third and fifth impurity diffusion layers is a common source region and the other is a common drain region.

17. The NAND flash memory device of claim 16, wherein the third selection gate line has a structure symmetric to the first selection gate line and the fourth selection gate line has a structure symmetric to the second selection gate line.

* * * * *